(12) United States Patent
Ohnishi et al.

(10) Patent No.: US 7,267,840 B2
(45) Date of Patent: Sep. 11, 2007

(54) MANUFACTURING METHOD OF PIEZOELECTRIC/ELECTROSTRICTIVE FILM TYPE DEVICE

(75) Inventors: Takao Ohnishi, Nishikasugai-Gun (JP); Masahiro Murasato, Chita (JP); Yuki Bessho, Nishikasugai-Gun (JP); Nobuo Takahashi, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 644 days.

(21) Appl. No.: 10/630,887

(22) Filed: Jul. 30, 2003

(65) Prior Publication Data

US 2004/0022935 A1 Feb. 5, 2004

Related U.S. Application Data

(60) Provisional application No. 60/400,513, filed on Aug. 2, 2002.

(51) Int. Cl.
*B05D 5/12* (2006.01)
(52) U.S. Cl. .................... 427/100; 427/287; 427/385.5
(58) Field of Classification Search .................. 427/287
See application file for complete search history.

(56) References Cited

U.S. PATENT DOCUMENTS

| | | | | |
|---|---|---|---|---|
| 5,376,857 A | * | 12/1994 | Takeuchi et al. | ............ 310/328 |
| 5,856,837 A | * | 1/1999 | Kitahara et al. | ............... 347/70 |
| 6,088,893 A | * | 7/2000 | Takeuchi et al. | ............ 29/25.35 |
| 2001/0046107 A1 | | 11/2001 | Irie et al. | |
| 2002/0051942 A1 | * | 5/2002 | Takeuchi et al. | ......... 430/280.1 |
| 2003/0234595 A1 | * | 12/2003 | Takahashi et al. | .......... 310/324 |
| 2004/0007947 A1 | * | 1/2004 | Takahashi et al. | .......... 310/363 |

FOREIGN PATENT DOCUMENTS

| | | |
|---|---|---|
| JP | 04-085976 A | 3/1992 |
| JP | 05-124188 A | 5/1993 |
| JP | 06-140683 A1 | 5/1994 |
| JP | 06-260694 A | 9/1994 |
| JP | 09-162452 A | 6/1997 |
| JP | 11-320894 A1 | 11/1999 |
| JP | 2000-210615 A | 8/2000 |
| JP | 1 187 234 A2 | 3/2002 |
| JP | 2002-079616 A1 | 3/2002 |

\* cited by examiner

*Primary Examiner*—Keith Hendricks
*Assistant Examiner*—Jimmy Lin
(74) *Attorney, Agent, or Firm*—Burr & Brown

(57) ABSTRACT

A method is provided for manufacturing a piezoelectric/electrostrictive film device including a ceramic substrate and a piezoelectric/electrostrictive operation portion including a lower electrode, a piezoelectric/electrostrictive layer, and upper electrode stacked on the substrate. The piezoelectric/electrostrictive layer is formed to extend beyond at least one of electrodes to form projected portions at its ends. The method includes the steps of forming the piezoelectric/electrostrictive layer so that ends of the piezoelectric/electrostrictive layer are projected to extend beyond ends of at least one electrode, applying a coating liquid in a sufficient amount so that the coating liquid permeates through a gap between at least the projected end portion of the piezoelectric/electrostrictive layer and the substrate, and so as to coat a predetermined portion of the at least one electrode, and drying the applied coating liquid to form a coupling member to couple the projected end portions of the piezoelectric/electrostrictive layer to the substrate.

12 Claims, 12 Drawing Sheets

MANUFACTURING METHOD OF PIEZOELECTRIC/ELECTROSTRICTIVE FILM TYPE DEVICE

BACKGROUND OF THE INVENTION

1. Field of the Invention

The present invention relates to a method of manufacturing a piezoelectric/electrostrictive film type device. More particularly, the present invention relates to a method of manufacturing a piezoelectric/electrostrictive film type device, in which the piezoelectric/electrostrictive film type device having a high resonance frequency can be manufactured with good efficiency while securing the conduction of each electrode.

2. Description of the Related Art

In recent years, piezoelectric/electrostrictive film type devices have been used in various applications such as a displacement control device, solid device motor, ink jet head, relay, switch, shutter, pump, optical modulation device, and fin. The film type device can control a minute displacement and has superior properties such as a high electromechanical transduction efficiency, high-speed response, high durability, and low power consumption. In recent years, however, in certain applications such as with an ink jet head, there has been a demand for a device having a higher speed response in view of the demand for the enhancement of printing quality and speed.

Additionally, piezoelectric/electrostrictive film type devices are generally produced by stacking a lower electrode, piezoelectric/electrostrictive layer, and an upper electrode in order on a substrate of a ceramic. However, in order to secure insulation between the electrodes while avoiding dielectric breakdown of the piezoelectric/electrostrictive layer, as shown in FIG. 15, a piezoelectric/electrostrictive film type device 30 has been developed including a piezoelectric/electrostrictive layer 73 disposed in such a size that an upper surface of a lower electrode 77 is coated and an end of the layer projects onto a substrate 44 (See JP-A-6-260694).

Moreover, in the conventional piezoelectric/electrostrictive film type device 30, a discontinuous plane is formed between a projecting portion 79 of the piezoelectric/electrostrictive layer 73 and the substrate 44. This is sometimes a cause for disconnection of the upper electrode 75. Therefore, it has also been described that a gap between the projecting portion 79 of the piezoelectric/electrostrictive layer 73 and the substrate 44 is filled with a predetermined resin layer (See said laid-open publication).

Needless to say, the piezoelectric/electrostrictive film type devices in which the resin layer is to be disposed, is very tiny, and it is difficult to coat only a predetermined portion with the resin layer. Therefore, the whole electrode has been coated with the resin layer under the present situation.

However, a large number of piezoelectric/electrostrictive film type devices are usually used in alignment and are electrically connected to one another. Therefore, it is quite important to manufacture the elelectrodes of each device so that the electrodes can be connected to another device or external connecting means, in order to manufacture final products having good efficiency. However, no consideration has been paid to this point in manufacturing the above-described piezoelectric/electrostrictive film type device. Therefore, an operation to remove a part of the resin layer formed on each electrode after forming the resin layer has been required. Additionally, damage such as cracks are generated in the resin layer that remains during the removing step. Furthermore, parts of the removed resin layer remain as particles in each portion of the device, which sometimes causes trouble with incomplete contact during the electric property inspection.

Moreover, in conventional piezoelectric/electrostrictive devices, based on the recognition that flexural displacement or generating force is adversely influenced by the connection between the projecting portion of the piezoelectric/electrostrictive layer and the substrate, an increase in the rigidity of the device has not been considered. Therefore, the recent demand to achieve a higher response speed has not necessarily been sufficiently satisfied.

SUMMARY OF THE INVENTION

The present invention has been developed in consideration of the above-described problem, and an object thereof is to provide a method of manufacturing a piezoelectric/electrostrictive film type device piezoelectric/electrostrictive having a high resonance frequency, in an efficient manner while securing the connection of each electrode.

That is, according to one embodiment of the present invention, a method of manufacturing is provided for a piezoelectric/electrostrictive film type device which includes a ceramic substrate, a piezoelectric/electrostrictive operation portion formed on the substrate which includes a lower electrode, a piezoelectric/electrostrictive layer, and an upper electrode. The piezoelectric/electrostrictive layer is formed to extend beyond ends of at least one of the electrodes, so that ends of the piezoelectric/electrostrictive layer project beyond the ends of the electrode. The method comprises the steps of:

forming the piezoelectric/electrostrictive layer of the piezoelectric/electrostrictive operation portion so that the projected portion of the piezoelectric/electrostrictive layer projects beyond the ends of at least one of the electrodes;

providing a coating liquid, which includes a polymerizable oligomer and inorganic particles that are mixed in a dispersing medium, in a sufficient amount to allow the coating liquid to permeate through a gap between at least the projecting portion of the piezoelectric/electrostrictive layer and the ceramic substrate and to coat a predetermined position of at least one of the electrodes; and drying the coating liquid to form a coupling member which couples the ends of the projected portion of the piezoelectric/electrostrictive layer to the substrate. This embodiment is hereinafter sometimes referred to as a "method of manufacturing a sandwiched piezoelectric/electrostrictive film type device."

According to the present invention, a piezoelectric/electrostrictive film type device having a multilayered piezoelectric/electrostrictive operation portion structure where a plurality of electrodes and a plurality of piezoelectric/electrostrictive layers are alternately stacked on a ceramic substrate, can also be manufactured. In that case, each piezoelectric/electrostrictive layer of the piezoelectric/electrostrictive electrostrictive operation portion can be formed in a range that is broader than that of at least one targeted electrode among electrodes layered below, so that the ends of each piezoelectric/electrostrictive layer project to extend beyond the at least one targeted electrode among electrodes layered below. This embodiment is sometimes hereinafter referred to as "a method of manufacturing a multilayered piezoelectric/electrostrictive film type device." Furthermore, in the present invention, the term "multilayered structure" denotes a structure wherein a plurality of electrodes and piezoelectric/electrostrictive layers are alternately layered one by one, and wherein at least two piezoelectric/electrostrictive layers and at least three electrode layers constitute the multilayered structure.

Here, in the specification, the projected end of the piezoelectric/electrostrictive layer is also referred to as "a projected portion of the piezoelectric/electrostrictive layer." This designates a portion where the lower or upper surface of the piezoelectric/electrostrictive layer does not contact an upper and/or a lower surface of any one of the electrodes. Moreover, the term electrode means that it includes, in addition to the impressed portion brought in contact with the piezoelectric/electrostrictive layer, a terminal portion disposed to establish a connection to the electrode.

In the present invention, when the coating liquid is applied, it is preferable to use a first coating apparatus comprising: pressurizing supply means for pressurizing/supplying a coating liquid to apply the coating liquid in a desired position and amount; switching means disposed in a supply path of the pressurizing supply means to switch the supply of the coating liquid; and a discharge head for discharging the coating liquid that is introduced from the supply path of the pressurizing supply means to the outside. The discharge head comprises: a substrate including a coating liquid introduction path connected to the supply path of the pressurizing supply means, a pressurizing chamber into which the coating liquid introduction path opens, and one or more coating liquid discharge paths or discharge nozzles connected and opened to the outside; and a piezoelectric/electrostrictive operation portion disposed in a position opposing the pressurizing chamber on the substrate. When the switching means is opened, the coating liquid introduced into the pressurizing chamber is continuously discharged in an atomized droplet state by flexural displacement of the piezoelectric/electrostrictive operation portion.

Alternatively, it is preferable to use a second coating apparatus comprising: a substrate including a coating liquid introduction path connected to a coating liquid supply source, a pressurizing chamber into which the coating liquid introduction path is opened, and one or more coating liquid discharge paths connected to the pressurizing chamber which opened to the outside; and a piezoelectric/electrostrictive operation portion disposed in a position opposing the pressurizing chamber. In accordance with the flexural displacement of the piezoelectric/electrostrictive operation portion, the coating liquid introduced into the pressurizing chamber is discharged in an atomized droplet state.

Moreover, for the first coating apparatus, the coating apparatus can include a discharge head including a plurality of coating liquid discharge paths having different nozzle sizes, or the coating apparatus can include a plurality of discharge heads having different nozzle sizes of the coating liquid discharge paths among the respective discharge heads.

For the second coating apparatus, the coating apparatus preferably includes a plurality of coating liquid discharge paths having different nozzle sizes to apply the coating liquid in an amount which differs with a discharge position. Moreover, the application of the coating liquid is preferably performed while vibrating at least one of the substrate or the piezoelectric/electrostrictive layer.

BRIEF DESCRIPTION OF THE DRAWINGS

FIG. 14($b$) is a partially sectional view showing one example of the multilayered piezoelectric/electrostrictive film type device in which micro-pores obtained by the manufacturing method of the present invention are filled.

DETAILED DESCRIPTION OF THE INVENTION

Figure 1:
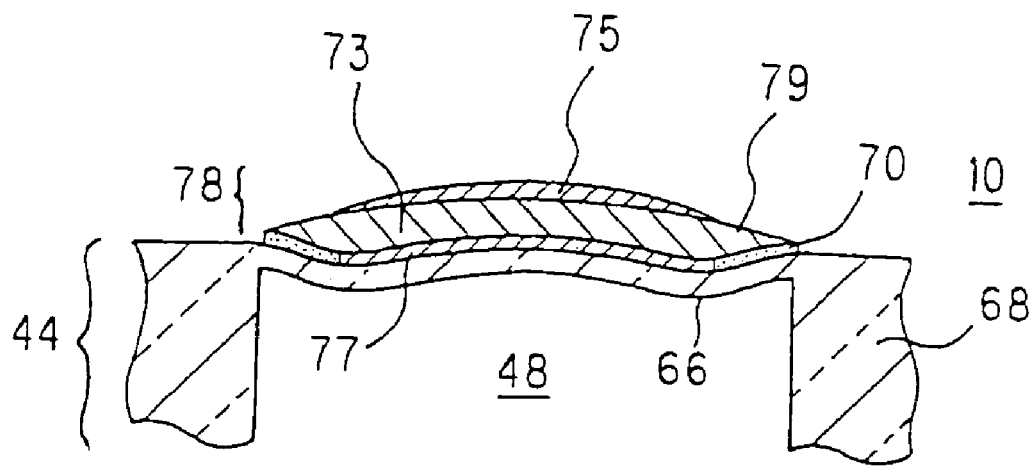
FIG. 1 is a partially sectional view showing one example of a sandwiched piezoelectric/electrostrictive film type device obtained by a manufacturing method of the present invention.

Although embodiments of piezoelectric/electrostrictive film type devices according to the present invention will concretely be described hereinafter, interpretation of the present invention is not limited to these embodiments. The present invention can be variously altered, modified, or improved based on the knowledge of a person skilled in the art without departing from the scope of the present invention.

The sandwiched piezoelectric/electrostrictive film type device of the present invention is a device including a piezoelectric/electrostrictive operation portion formed on a ceramic substrate and which includes a lower electrode, piezoelectric/electrostrictive layer, and upper electrode. The device is manufactured by a method comprising the steps of forming a piezoelectric/electrostrictive layer of the piezoelectric/electrostrictive operation portion in a range that is broader tan that of at least one of electrodes so that the projecting ends of the piezoelectric/electrostrictive layer extend beyond ends of the electrode; preparing a coating liquid by admixing a polymerizable oligomer and inorganic particles in a dispersing medium in an amount sufficient to allow the coating liquid to permeate through a gap between at least the projecting end portion of the piezoelectric/electrostrictive layer and the substrate and applying the coating liquid to a predetermined portion of the at least one of the electrodes; and drying the coating liquid to form a coupling member to couple the projected end portion of the piezoelectric/electrostrictive layer to the substratepiezoelectric/electrostrictivepiezoelectric/electrostrictive.

Moreover, the present method may be used to produce a device having a multilayered piezoelectric/electrostrictive operation portion structure, wherein a plurality of electrodes and a plurality of piezoelectric/electrostrictive layers are alternately stacked on a substrate of ceramic. In that case, each piezoelectric/electrostrictive layer of the piezoelectric/electrostrictive operation portion is disposed in a range broader than that of at least one targeted electrode out of electrodes so that the projecting ends of the piezoelectric/electrostrictive layer extend beyond the ends of the targeted electrode. In this respect, at least one of the electrodes beyond which the ends of the piezoelectric/electrostrictive layer extend is preferably a lower electrode.

The ends of the piezoelectric/electrostrictive layer may be formed to extend beyond all of the ends of the electrodes in not only the sandwiched type device, but also in the multi-layered type device, as long as the performance of the device is not affected adversely to a great extent. By doing so, a piezoelectric/electrostrictive film type device can be manufactured to have a superior high speed response while retaining flexural displacement characteristics that are at least equal to those of a conventional piezoelectric/electrostrictive film type device having a secured state of connection between the piezoelectric/electrostrictive layer and each electrode, but without requiring the operation of removing a coated layer on the electrode. The present invention will concretely be described with reference to the drawings.

As shown in FIGS. 1 to 6, a substrate 44 according to the present invention includes, for example, a structure in which a thin portion 66 having a thin plate shape is formed integrally with a fixing portion 68 formed of a thick ceramic member. Moreover, in the substrate 44 having this structure, the thin portion 66 having a sheet-like shape is solidly attached to the fixing portion 68 in a position other than a position where the piezoelectric/electrostrictive layer 73 is disposed. A cavity 48 is usually formed opposing the position where the piezoelectric/electrostrictive layer 73 is disposed under the thin portion 66.

Figure 2:
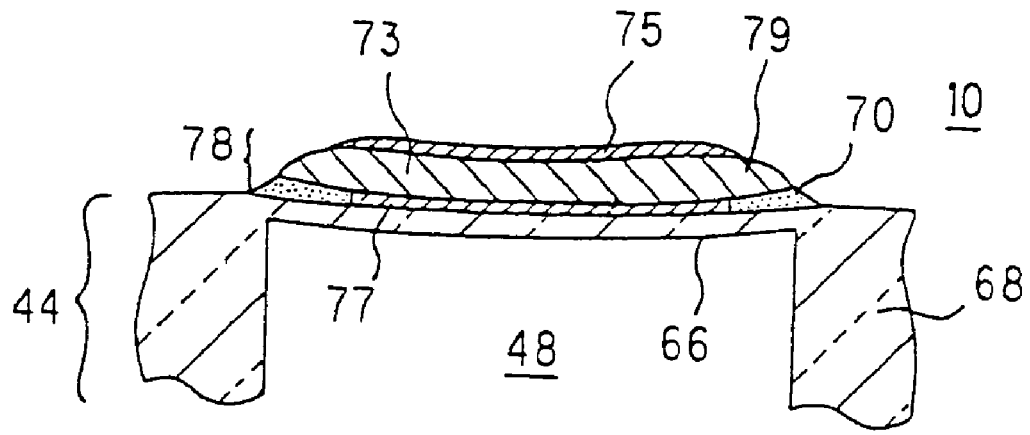
FIG. 2 is a partially sectional view showing another example of the sandwiched piezoelectric/electrostrictive film type device obtained by the manufacturing method of the present invention.
Figure 3:
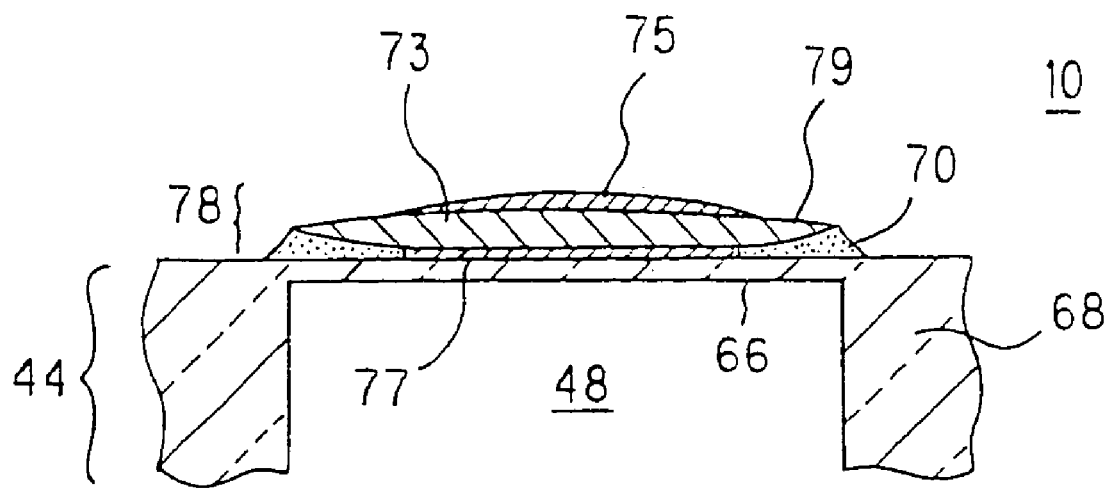
FIG. 3 is a partially sectional view showing still another example of the sandwiched piezoelectric/electrostrictive film type device obtained by the manufacturing method of the present invention.
Figure 4:
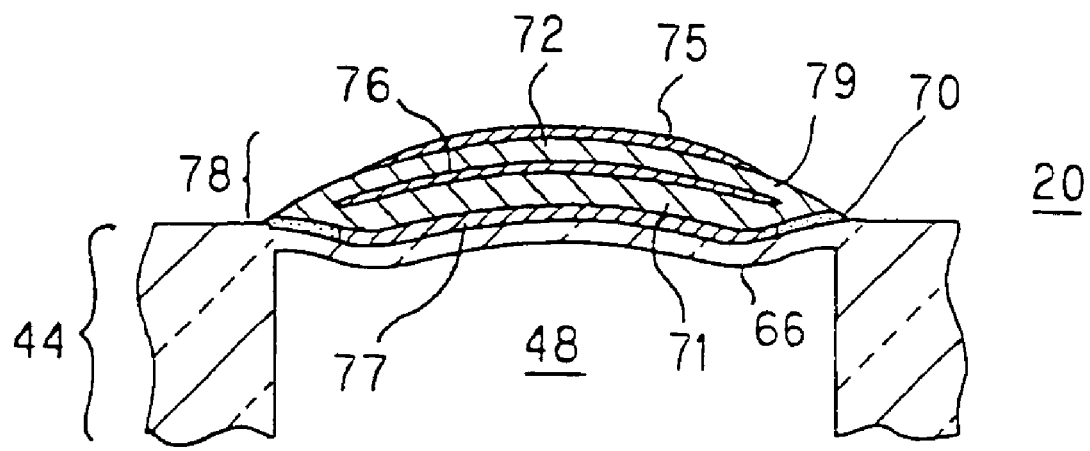
FIG. 4 is a partially sectional view showing one embodiment of a multilayered piezoelectric/electrostrictive film type device obtained by the manufacturing method of the present invention.
Figure 5:
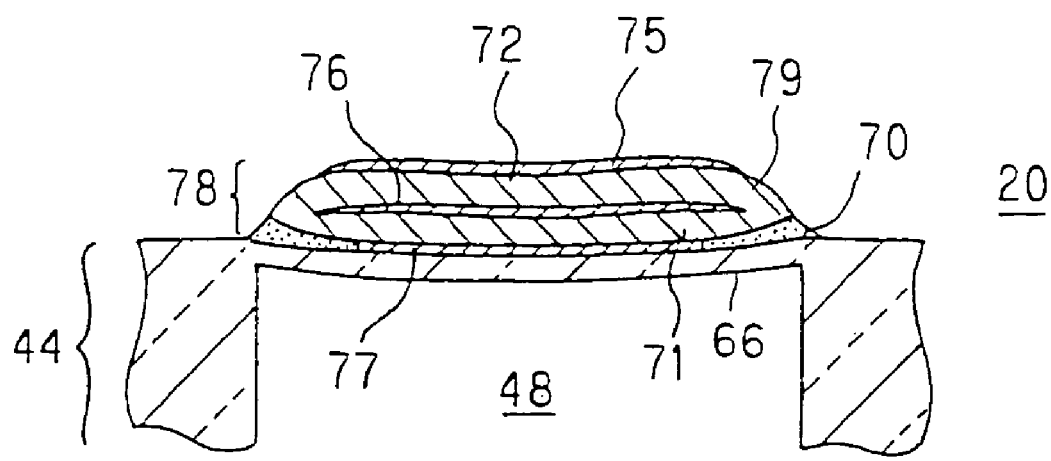
FIG. 5 is a partially sectional view showing another example of the multilayered piezoelectric/electrostrictive film type device obtained by the manufacturing method of the present invention.
Figure 6:
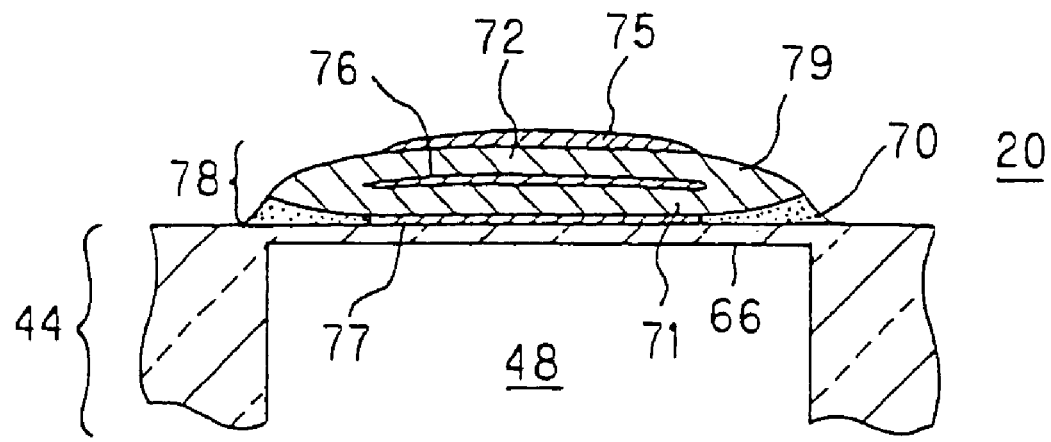
FIG. 6 is a partially sectional view showing still another example of the multilayered piezoelectric/electrostrictive film type device obtained by the manufacturing method of the present invention.

Moreover, as shown in FIGS. 3 and 6, the thin portion 66 may also be formed of a flat plate having a rectangular section in the thickness direction. The thin portion 66, whose middle portion has a shape that is bent toward the cavity 48 as shown in FIGS. 2 and 5, or whose section has a W shape in the thickness direction as shown in FIGS. 1 and 4, is preferred in that the flexural displacement is large. The thin portion having the latter W-shaped section is especially preferable.

The thin portion 66 having the bent shape as shown in FIGS. 2 and 5 or the W shape as shown in FIGS. 1 and 4 can be formed by using shrinkage of a piezoelectric/electrostrictive film in a short direction during the step of sintering the piezoelectric/electrostrictive layer 73, or by adjusting the sintering shrinkage start timing or sintering shrinkage of the upper and lower portions of the piezoelectric/electrostrictive layer 73 or the shape of the thin portion 66.

In the present invention, the thickness of the thin portion 66 is preferably set to such a range that the mechanical strength of the device is secured and the flexural displacement of the piezoelectric/electrostrictive layer 73 is further prevented from being deteriorated by an increase of rigidity. Concretely, the thickness is in a range of preferably 1 μm to 50 μm, more preferably 3 to 50 μm, especially preferably 3 to 12 μm. The thickness of the fixing portion 68 is preferably 10 μm or more, more preferably 50 μm or more.

The shape of the surface of the substrate 44 on which the piezoelectric/electrostrictive operation portion 78 is disposed is not especially limited to the rectangular shape. The surface may also be formed in a circular shape, or a polygonal shape other than a square shape, such as a triangular shape.

The substrate 44 for use in the present invention may be formed of a ceramic material, but is preferably prepared from a material whose properties do not change during the heat treatment of the piezoelectric/electrostrictive layer 73 or the electrodes 75, 77 stacked on the thin portion 66, and which has superior in heat resistance and chemical stability. The substrate 44 is preferably formed of an electric insulation material so that wiring connected to a lower electrode 77 formed on the substrate 44 is electrically disconnected.

Concretely, examples of the substrate material include at least one ceramic material selected from a group consisting of (stabilized) zirconium oxide, aluminum oxide, magnesium oxide, titanium oxide, cerium oxide, spinel, mullite, aluminum nitride, silicon nitride, and glass. Above all, the material containing stabilized zirconium oxide is preferred in that the mechanical strength is high, the tenacity is superior, the chemical stability is high, and reactivity with the piezoelectric/electrostrictive layer 73 or the electrodes 75, 77 is remarkably small.

Moreover, examples of stabilized zirconium oxide may contain stabilizers such as calcium oxide, magnesium oxide, yttrium oxide, scandium oxide, ytterbium oxide, cerium oxide, and rare earth metal oxide. For an added amount of the stabilizer, the amount of yttrium oxide or ytterbium oxide is preferably 1 to 30 mol %, more preferably 1.5 to 10 mol %. The amount of cerium oxide is preferably 6 to 50 mol %, more preferably 8 to 20 mol %. The amount of calcium oxide or magnesium oxide is preferably 5 to 40 mol %, more preferably 5 to 20 mol %.

Furthermore, among these stabilizers, yttrium oxide is especially preferably added in an amount of preferably 1.5 to 10 mol %, especially preferably 2 to 4 mol %.

Additionally, the thin portion 66 may contain, in addition to ceramic described above, components such as silicon oxide or boron oxide contained in clay for use as a sintering aid. However, when these components are excessively contained, it is difficult to maintain a specific composition of the piezoelectric/electrostrictive layer 73 by reaction between the substrate 44 and piezoelectric/electrostrictive layer 73, and this is a cause for the deterioration of piezoelectric/electrostrictive properties. Therefore, for the thin portion 66 of the substrate 44 of the present invention, silicon oxide or boron oxide contained in clay is preferably in a range of 20% or less by mass, more preferably 3% or less by mass in the material constituting the thin portion 66.

Furthermore, the ceramic constituting the thin portion 66 preferably has an average particle diameter of crystal grains in a range of 0.05 to 2 μm, more preferably 0.1 to 1 μm, in order to enhance the mechanical strength of the thin portion 66.

Next, in the method of manufacturing the present invention, for a sandwiched piezoelectric/electrostrictive film type device 10 shown in FIGS. 1 to 3, a piezoelectric/electrostrictive operation portion 78, in which the lower electrode 77, piezoelectric/electrostrictive layer 73, and upper electrode 75 are stacked, is disposed on the substrate 44. For a multilayered piezoelectric/electrostrictive film type device 20 shown in FIGS. 4 to 6, the piezoelectric/electrostrictive operation portion 78 in which a plurality of electrodes 75 to 77 are stacked alternately with a plurality of piezoelectric/electrostrictive layers 71, 72, is disposed on the substrate 44. Moreover, in the present invention, in any of the piezoelectric/electrostrictive film type devices 10, 20, the piezoelectric/electrostrictive layer 73, 71, 72 of the piezoelectric/electrostrictive operation portion 78 is formed in a range broader than that of at least one of electrodes 75 to 77 (the lower electrode 77 and upper electrode 75 for the sandwiched piezoelectric/electrostrictive film type device), and the ends of the piezoelectric/electrostrictive layer are projected to extend beyond the ends of at least one of the electrodes.

Accordingly, in any piezoelectric/electrostrictive film type device 10 (20), the insulation of the respective electrodes 75, 77 (75 to 77) is firmly secured, and a piezoelectric/electrostrictive film type device 10 (20) which is free of dielectric breakdown or short circuit can be provided. It is to be noted that in the present invention, for the piezoelectric/electrostrictive film type device 20 including the multilayered structure shown in FIGS. 4 to 6, the rigidity of the whole piezoelectric/electrostrictive operation portion 78 increases. By a synergistic effect with a coupling member described later, a piezoelectric/electrostrictive film type device having a high resonance frequency and in which a high speed response is possible can be obtained. In this respect, the electrodes 75, 77 are preferably disposed in the uppermost and lowermost layers in the piezoelectric/electrostrictive operation portion 78.

Moreover, the electrodes 75, 77 (75 to 77) are preferably formed of materials that are solid at room temperature, which can withstand a high-temperature oxidation atmosphere during the sintering and integrating of the electrodes and the substrate and/or the piezoelectric/electrostrictive layer, and which has superior electric conductivity. Concrete examples of the electrode materials include aluminum, titanium, chromium, iron, cobalt, nickel, copper, zinc, niobium, molybdenum, ruthenium, palladium, rhodium, silver, tin, tantalum, tungsten, iridium, platinum, gold, lead, and another simple metal or an alloy of these. A cermet material may also be used, in which the material constituting the piezoelectric/electrostrictive layer, or the material constituting the substrate 44, such as zirconium oxide, cerium oxide, and titanium oxide, is dispersed in the metals described above.

Moreover, it is preferred to choose a material for the electrodes 75, 77 (75 to 77) in the present invention, taking into consideration a method of forming the piezoelectric/electrostrictive layer 73 (71, 72). For example, in the method of manufacturing the sandwiched piezoelectric/electrostrictive film type device 10 shown in FIGS. 1 to 3, during the heating treatment of the piezoelectric/electrostrictive layer 73, in the lower electrode 77 already formed on the substrate 44, it is preferable to use a simple metal of a platinum group which does not change even at a heating treatment temperature of the piezoelectric/electrostrictive layer 73, an alloy of the simple metal of the platinum group and gold and/or silver, an alloy of the platinum group metals, an alloy of two or more different types of metals of the platinum group, or high-melting metals such as an alloy of the metals of the platinum group and gold and/or silver. Also in the method of manufacturing the multilayered piezoelectric/electrostrictive film type device 20 shown in FIGS. 4 to 6, it is preferable to use the high-melting point metals in the electrode 77 positioned in the lowermost layer and to provide an intermediate electrode 76 disposed between the piezoelectric/electrostrictive layers 71, 72, which are already formed during the heat treatment of the piezoelectric/electrostrictive layers 71, 72.

On the other hand, in the sandwiched piezoelectric/electrostrictive film type device 10 shown in FIGS. 1 to 3, after the heat treatment of the piezoelectric/electrostrictive layer 73, the upper electrode 75 can be formed on the piezoelectric/electrostrictive layer 73 at a low temperature. Alternatively, in the multilayered piezoelectric/electrostrictive film type device 20 shown in FIGS. 4 to 6, the electrode 75 positioned in the uppermost layer can be formed at the low temperature. Therefore, in addition to the high-melting point metals, low-melting metals such as aluminum, gold, and silver may also be used.

Moreover, in the multilayered piezoelectric/electrostrictive film type device shown in FIGS. 4 to 6, the electrode 77 positioned in the lowermost layer, and the intermediate electrode 76 disposed between the piezoelectric/electrostrictive layers 71, 72 are also preferably constituted of electrode materials which contain platinum as a major component, and which further contain additives such as zirconium oxide, cerium oxide, and titanium oxide. Although the reasons are unclear, the electrodes and piezoelectric/electrostrictive device constituted of these materials can be prevented from peeling. Moreover, the additives are preferably contained in all the electrode materials in an amount of 0.01 to 20% by mass in order to obtain the desired peel preventive effect.

In the present invention, examples of the method of forming the electrodes include ion beam, sputtering, vacuum deposition, PVD, ion plating, CVD, plating, screen printing, spraying, and dipping.

In the present invention, thicknesses of the electrodes 75, 77 (75 to 77) may be set to be appropriate in accordance with applications. However, with excess thicknesses, the electrodes function as relaxing layers, and the flexural displacement is easily reduced. Therefore, a thickness of 15 μm or less is preferable, and a thickness of 5 μm or less is more preferable.

Next, in the present invention, the piezoelectric/electrostrictive layer 73 (71, 72) in the sandwiched piezoelectric/electrostrictive film type device shown in FIGS. 1 to 3 can be obtained by heat treatment at a predetermined temperature after coating the electrodes 75, 77 with a predetermined piezoelectric/electrostrictive material. Moreover, for the multilayered piezoelectric/electrostrictive film type device 20 shown in FIGS. 4 to 6, when the piezoelectric/electrostrictive materials are stacked among the electrodes 75 to 77 positioned in the lowermost and intermediate layers, or after all the respective piezoelectric/electrostrictive layers 71, 72 are stacked, the piezoelectric/electrostrictive layers can be heat-treated at a predetermined temperature and obtained.

The piezoelectric/electrostrictive material for use in the present invention may be crystalline or amorphous as long as field inducing strains such as piezoelectric or electrostrictive effects are caused after the heating treatment. Any of a semiconductor, ferroelectric ceramic, and antiferroelectric ceramic may be used in the piezoelectric/electrostrictive material, and the material may appropriately be selected/used in accordance with the application.

Concrete examples of the material include a ceramic containing one alone or two or more of lead zirconate, lead titanate, lead zirconate titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuth tantalite.

Especially, a material containing lead zirconate titanate (PZT-system) and/or lead magnesium niobate (PMN-system) as a major component, or sodium bismuth titanate as the major component is preferable, in that a stabilized composition having a high electromechanical coupling coefficient and piezoelectric constant and little reactivity with the ceramic substrate at the sintering time of the piezoelectric/electrostrictive film is obtained.

Furthermore, a ceramic material may also be used which contains a small amount of components to which at least one alone or two or more oxides of lanthanum, calcium, strontium, molybdenum, tungsten, barium, niobium, zinc, nickel, manganese, cerium, cadmium, chromium, cobalt, antimony, iron, yttrium, tantalum, lithium, bismuth, and tin are added. For example, when lead zirconate, lead titanate, and/or lead magnesium niobate as the major components contain lanthanum or strontium, anti-electric field or piezoelectric property can be adjusted.

These piezoelectric/electrostrictive materials can be prepared, for example, by an oxide mixing method. For example, material powder containing PbO, $SrCO_3$, $MgCO_3$, $Nb_2O_5$, $ZrO_2$, and the like can be weighed so as to obtain a predetermined composition, mixed, tentatively sintered, and crushed. The material can be prepared in this method. Examples of another method include the coprecipitation method, and the alkoxide method.

Moreover, examples of a method of applying the piezoelectric/electrostrictive material include: various thick-film forming methods such as screen printing, dipping, coating, and electrophoretic migration; and various thin-film forming methods such as ion beam, sputtering, vacuum deposition, ion plating, chemical vapor deposition (CVD), and plating. Above all, since a piezoelectric/piezoelectric/electrostrictive layer 73 having satisfactory piezoelectric/electrostrictive properties is obtained, thick-film forming methods such as screen printing, dipping, coating, and electrophoretic migration are preferred.

It is to be noted that the piezoelectric/electrostrictive material may be printed or applied in an area broader than that of at least one of the electrodes in order to form the projecting end portion 79. In the present invention, the projecting end portion 79 may partially be bonded to the substrate 44. However, to avoid the reduction of the flexural displacement, preferably, the projecting portion is not directly bonded to the substrate 44. To obtain this non-bonded state, for example, the substrate 44 is preferably formed of a material having little reactivity with the piezoelectric/electrostrictive material during the heat treatment time, such as zirconium oxide.

Moreover, when the multilayered piezoelectric/electrostrictive film type device 20 shown in FIGS. 4 to 6 is formed, for example, the electrode 77 is stacked on the substrate 44, and subsequently, the piezoelectric/electrostrictive materials are alternately stacked with the plurality of electrodes 75, 76 by the above-described various methods.

In the present invention, the thickness of the piezoelectric/electrostrictive material layer is preferably set to be substantially equal to that of the thin portion 66 in the substrate in order to secure the mechanical strength and desired flexural displacement of the device. Concretely, a ratio of the thickness to that of the thin portion 66 of the substrate (the thin portion /a layer made of the piezoelectric/electrostrictive material) is preferably 0.1 to 30, more preferably 0.3 to 10, and especially preferably 0.5 to 5.

When the ratio of the thickness of the thin portion 66 in the substrate to that of the piezoelectric/electrostrictive layer (the thin portion/(the layer made of the substrate/the piezoelectric/electrostrictive material)) is in this range, the substrate (the thin portion) easily follows the sintering shrinkage of the piezoelectric/electrostrictive layer at a time of the coating of the substrate with the piezoelectric/electrostrictive material and the subsequent heating treatment for forming the piezoelectric/electrostrictive layer. A dense piezoelectric/electrostrictive layer can be formed without causing the peel. A sufficient resistance to the vibration by the bending of the piezoelectric/electrostrictive layer can be imparted.

Needless to say, with respect to the thickness of the layer of piezoelectric/electrostrictive material, in order to realize the miniaturization of the device, the thickness is preferably 5 to 100 µm, more preferably 5 to 50 µm, and especially preferably 5 to 30 µm.

Moreover, in the multilayered piezoelectric/electrostrictive film type device 20 shown in FIGS. 4 to 6, the piezoelectric/electrostrictive film type device is formed in a thin film shape, and an aspect ratio can be raised. Therefore, the thickness per layer formed of the piezoelectric/electrostrictive material is preferably set to 30 µm or less. Furthermore, a plurality of layers of piezoelectric/electrostrictive materials are preferably formed so that the layers gradually become thin in order from the lower layer. For example, the layers are preferably formed so that a thickness $t_n$ of an n-th layer of piezoelectric/electrostrictive material from below satisfies the equation: $t_n \leq t_{n-1} \times 0.95$. The strain of the piezoelectric/electrostrictive layer is large at the same driving voltage when the piezoelectric/electrostrictive layer has a small thickness. Therefore, the upper piezoelectric/electrostrictive layer is formed so that the layer is strained more than the lower piezoelectric/electrostrictive layer. Accordingly, the bending efficiency is improved, and the flexural displacement can be more effectively developed.

In the present invention, after forming the layer of the predetermined piezoelectric/electrostrictive material, the heat treatment of the layer of the piezoelectric/electrostrictive material is preferably performed at a temperature of 1000 to 1400° C. The heat treatment is preferably performed in the presence of an atmosphere controlling material including the same composition as that of the piezoelectric/ electrostrictive material in order to obtain a ceramic composite which includes the desired composition.

Figure 7:
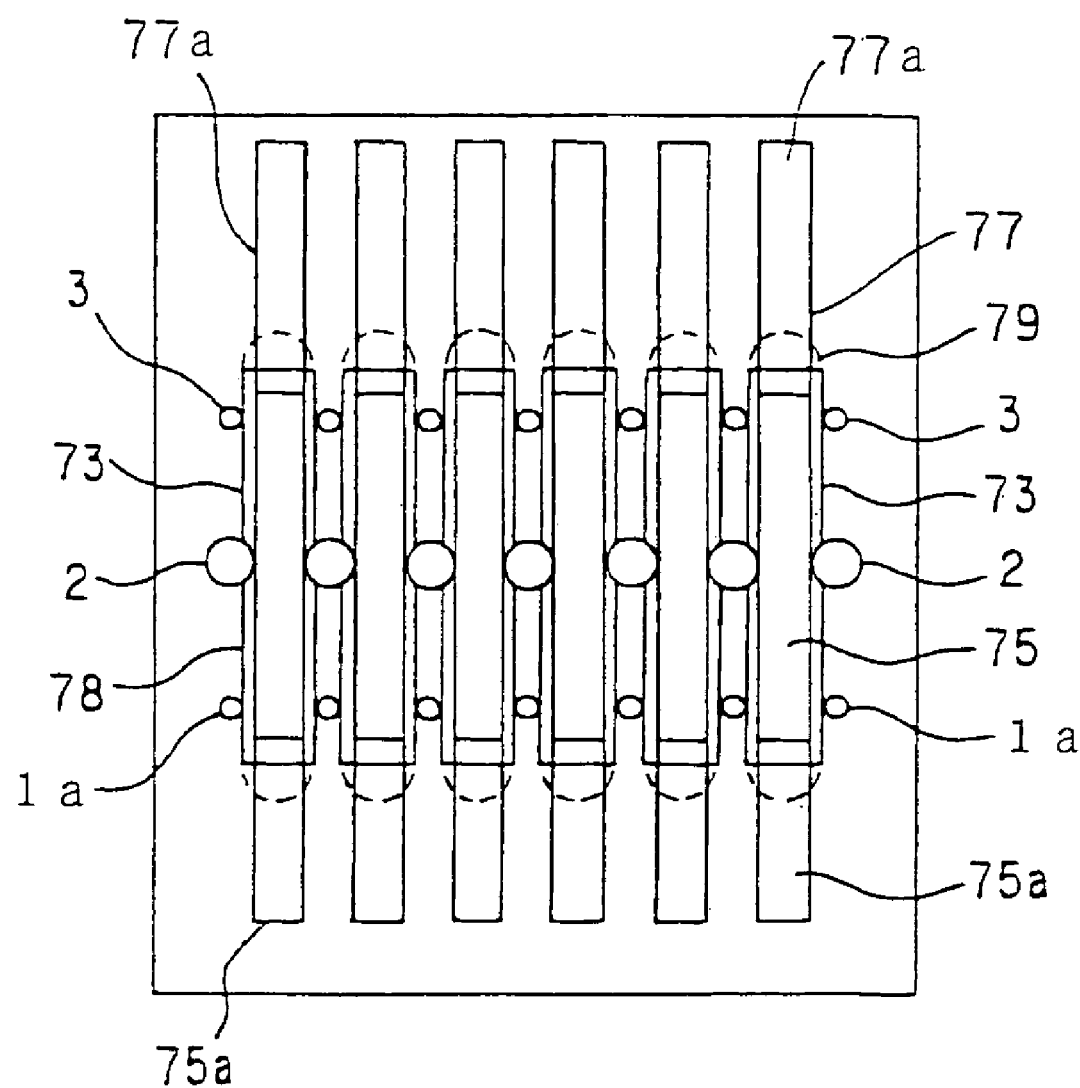
FIG. 7 is a top plan view schematically showing a state of the piezoelectric/electrostrictive film type device immediately after application of a different discharge amount of coating liquid in the manufacturing method of the present invention.

Next, in the method of manufacturing the present invention, as shown in FIG. 7, a coating liquid is prepared by mixing and dispersing a polymerizable oligomer and inorganic particles mixed in a dispersing medium, using an appropriate coating apparatus having a discharging portion, to the positions numbered with 1a, 2 and 3, respectively, and the coating liquid is applied in a sufficient amount, without coating at least a part of each electrode. Thereafter, the thus applied coating liquid is allowed to strand so as to make a predetermined portion covered with the coating liquid, thereby the coating liquid can permeate through a gap between at least the projecting portion 79 of the piezoelectric/electrostrictive layer 73 and the substrate 44. Then, the resultant structure is subjected to a drying step to form a coupling member to couple the projected end portion of the piezoelectric/electrostrictive layer and the substrate. This drawing shows the state immediately after the coating liquid has been applied in a desired amount to the positions 1a, 2, and 3. The coating liquid thus applied instantly permeates through the gap between the projecting portions 79 of the piezoelectric/electrostrictive layer and the substrate 44. This drawing shows a case wherein the end portions 75a and 77a have not been coated. Indeed, one may choose freely the positions to be coated with a coating liquid, taking into consideration the portion to which no coated portion is disposed.

Accordingly, a piezoelectric/electrostrictive film type device having a high resonance frequency can be obtained in a state where the connection of the respective electrodes to the outside can easily be secured. In addition, there is no need to perform a peeling operation to remove the coat layer formed on the electrode, which is otherwise necessary for the application by a spin coating method. The secondary trouble caused by dust generated by the peeling can be prevented.

Figure 8A:
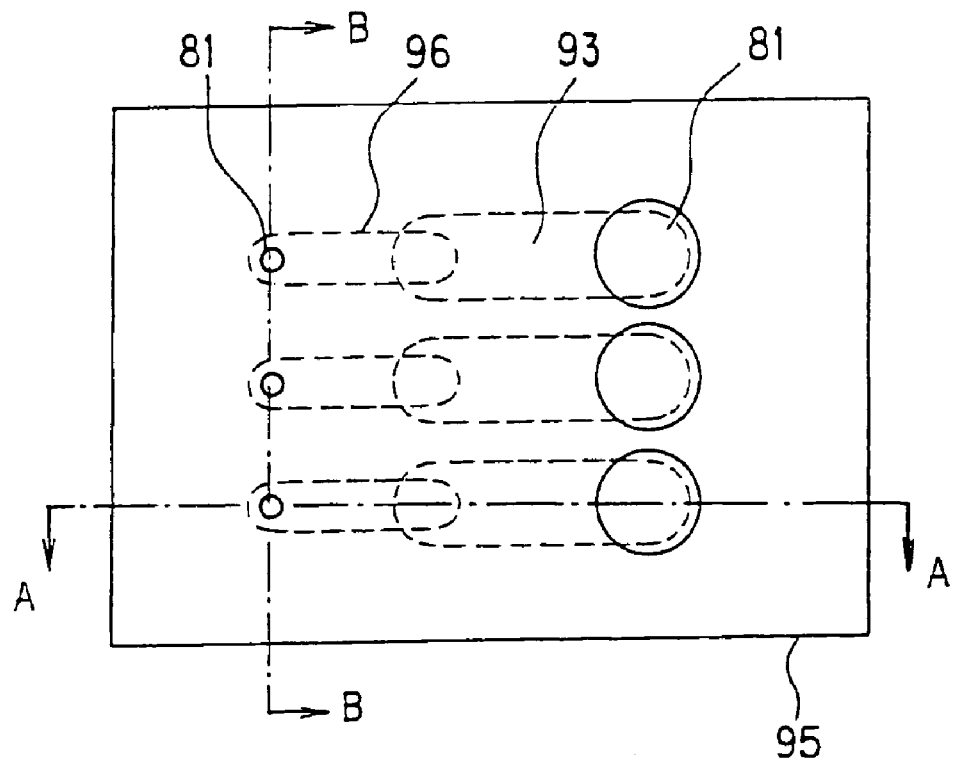
FIG. 8($a$) is a top plan view of an on-demand type discharge apparatus for use in the manufacturing method of the present invention, and FIG. 8($b$) is an A-A sectional view of FIG. 8($a$).

The coating liquid for use in the present invention flows easily. In the application of the solution, coating means capable of applying micro droplets of several to 1000 pL at a rate of several m/second to 20 m/second is preferably used. For example, as shown in FIGS. 8(a), (b), it is preferable to use a coating apparatus including: a substrate 95 including a coating liquid introduction path 92 connected to a coating liquid supply source 81, a pressurizing chamber 93 in which the coating liquid introduction path 92 opens, and a plurality of coating liquid discharge paths 94 connected to the pressurizing chamber 93 and opened to the outside; and a piezoelectric/electrostrictive operation portion 96 disposed in a position opposite to the pressurizing chamber 93 on the substrate 95. An outer wall of the pressurizing chamber 93 is pushed in accordance with the flexural displacement of the piezoelectric/electrostrictive operation portion 96, and the coating liquid 1 introduced into the pressurizing chamber 93 is discharged in an atomized droplet state in the coating apparatus (hereinafter referred to as an "on-demand type coating apparatus").

Alternatively, as shown in FIG. 9, it is preferable to use a coating apparatus including: pressurizing supply means 101 for pressurizing/supplying the coating liquid 1; switching means 103 which is disposed in a supply path 102 of the pressurizing supply means 101 to switch the supply of the coating liquid 1; and a discharge head 104 for discharging the coating liquid 1 introduced from the supply path 102 of the pressurizing supply means 101 to the outside. The discharge head 104 includes: a substrate 108 including a coating liquid introduction path 105 connected to the supply path 102 of the pressurizing supply means 101, a pressurizing chamber 106 in which the coating liquid introduction path 105 opens, and a plurality of coating liquid discharge paths 107 connected to the pressurizing chamber 106 and opened to the outside; and a piezoelectric/electrostrictive operation portion 109 disposed in a position opposite to the pressurizing chamber 106 on the substrate 108. When the switching means 103 is opened, the outer wall of the pressurizing chamber 106 is pushed by the flexural displacement of the piezoelectric/electrostrictive operation portion 109, and the coating liquid introduced into the pressurizing chamber 106 is continuously discharged in the atomized droplet state in the coating apparatus (hereinafter referred to as "a continuous coating apparatus").

According to the on-demand type of coating apparatus, since the coat amount can precisely be controlled, and the coating timing is precise, a predetermined amount of solution can be precisely supplied to a predetermined position, whereby the accuracy of the coat position is improved, and the film thickness of the coating can further be made uniform.

Figure 8B:
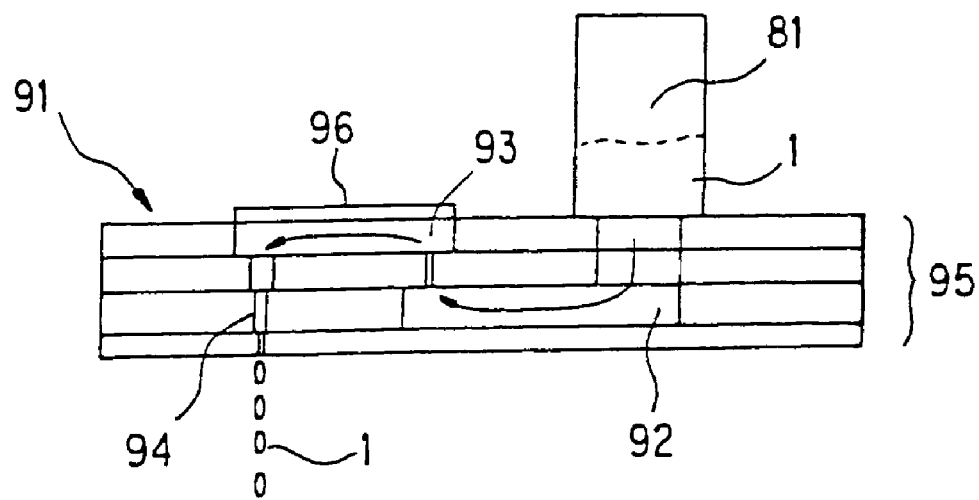

First, according to the continuous coating apparatus, it is easy to apply a large amount of a highly viscous solution in a very small amount by the pressurizing supply means. Therefore, the coating liquid little spreads over the substrate, a coat pattern is miniaturized, and a small amount of droplets can be supplied in a large amount, the coating time can therefore be reduced, and the device can be produced with good efficiency. Since the solution is pressurized, the probability that coating is impossible because of dried coating liquid in the nozzle can be reduced, and stable coating is possible. It is to be noted that in FIGS. 8(b) and 9(b), the arrows show the channels of the coating liquid.

Furthermore, in the continuous coating apparatus, a regulator 121 for pressure adjustment is also preferably disposed between the pressurizing supply means 101 and switching means 103 so that stability of the coating liquid amount can be enhanced. To enhance the response of the coating liquid, pressure release means 122 is similarly preferably disposed between the pressurizing supply means 101 and switching means 103.

Figure 9A:
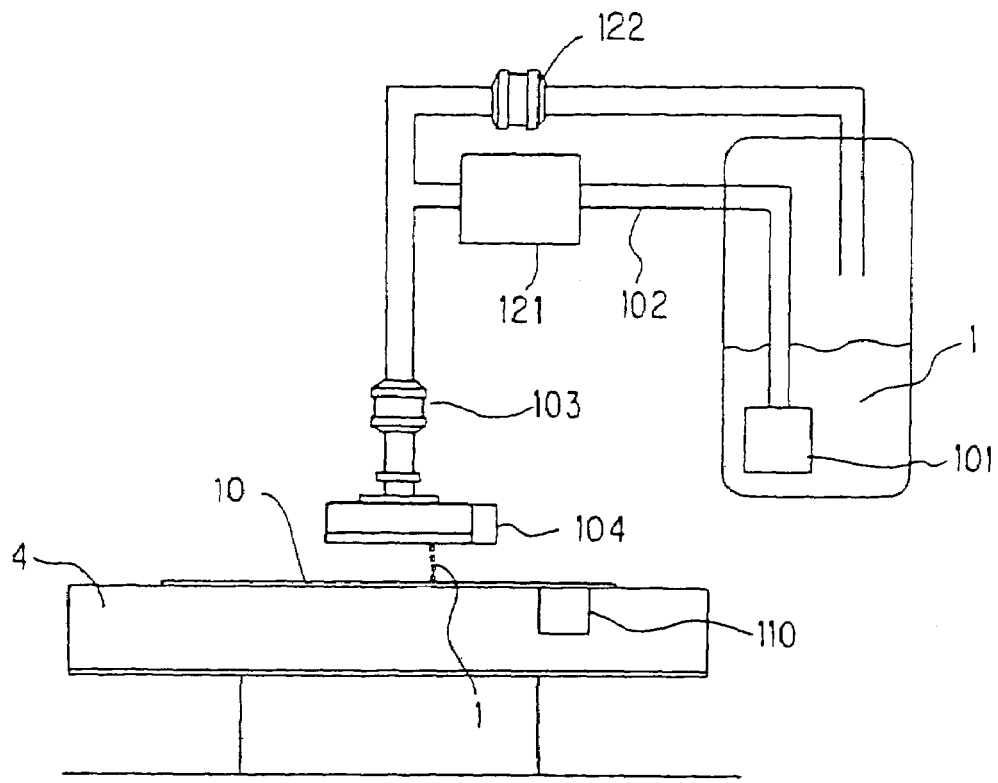
FIG. 9($a$) is a whole view schematically showing a continuous discharge apparatus for use in the manufacturing method of the present invention, and FIG. 9($b$) is a partially enlarged sectional view showing a portion of a discharge head of FIG. 9($a$).
Figure 9B:
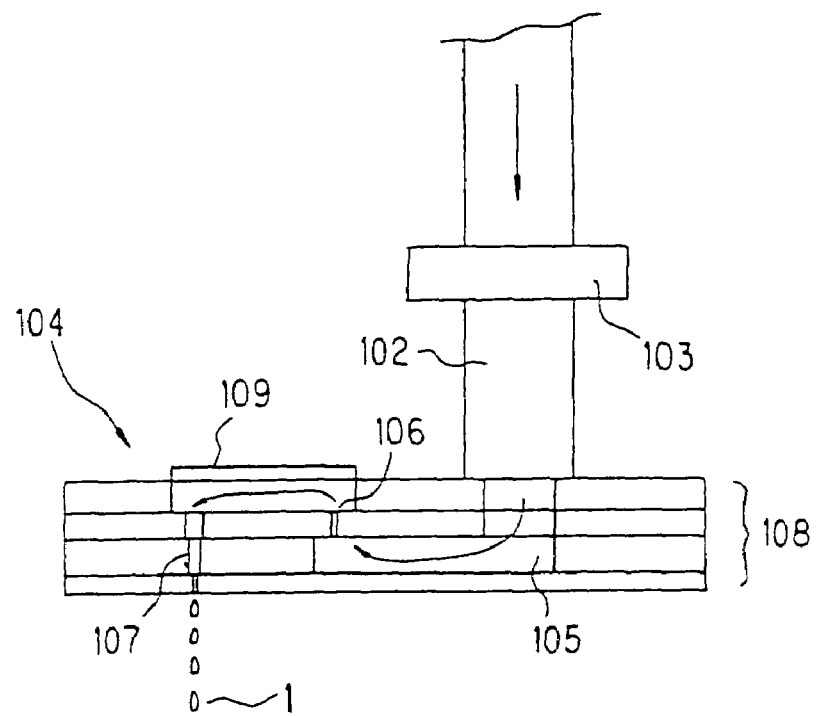

Additionally, in the present invention, when the continuous coating apparatus or the on-demand type coating apparatus is used, it is preferable to fix the piezoelectric/electrostrictive film type device 10 on an XY stage 4 shown in FIG. 9(a) and apply the coating liquid. Accordingly, the coating liquid can easily be applied to the predetermined position.

Moreover, in the present invention, the on-demand type fine coating apparatus is preferably combined/used with the continuous fine coating apparatus, so that the solution can be applied in a very fine pattern and can efficiently be applied in a broader range. For example, when the coating liquid is applied to the desired positions 1a, 2 and 3, as shown in FIG. 7, the coating liquid may be preferably applied to the position 2 where the application in the broad range is required with a continuous coating apparatus. The coating liquid may be preferably applied to the positions 1a and 3 wherein the formation of a finer pattern is required with an on-demand type coating apparatus.

More concretely, a large amount of the coating liquid is applied with the continuous coating apparatus in a peripheral edge of the piezoelectric/electrostrictive operation portion 78 in which the gap between the piezoelectric/electrostrictive larger 73 and substrate 44 is open, the position 2 being located at a substantially equal distance from the terminal portion 75a of the upper electrode 75 and the terminal portion 77a of the lower electrode. With an on-demand coating apparatus, a small amount of the coating liquid is applied in the peripheral edge of the piezoelectric/electrostrictive operation portion 78, the positions 1a and 3 being located at the vicinity of the terminal portion 75a of the upper or lower electrode (within 0.5 mm from the terminal portion 75a).

When the coating methods are combined in this manner, a large amount of coating liquid is diffused in the periphery and can be efficiently applied from a position most distant from the terminal portion 75a of the upper electrode 75 and the terminal portion 77a of the lower electrode 77. Moreover, a small amount of coating liquid is applied in the vicinity of the terminal portions 75a, 77a of the upper electrode 75 and lower electrode 77. Accordingly, for the gap between the projecting portion of the piezoelectric/electrostrictive layer and the substrate, the coating liquid can also permeate through the portions in the vicinity of the terminal portions 75a, 77a of the upper electrode 75 and lower electrode 77 in the same manner as in the other portions while avoiding the coating of other parts of the respective electrodes 75, 77. Thus, while the conduction of each electrode is secured, the piezoelectric/electrostrictive film type device including the desired coupling member material formed in the gap between the projecting portion of the piezoelectric/electrostrictive layer and the substrate and having a high resonance frequency can be manufactured.

Figure 10:
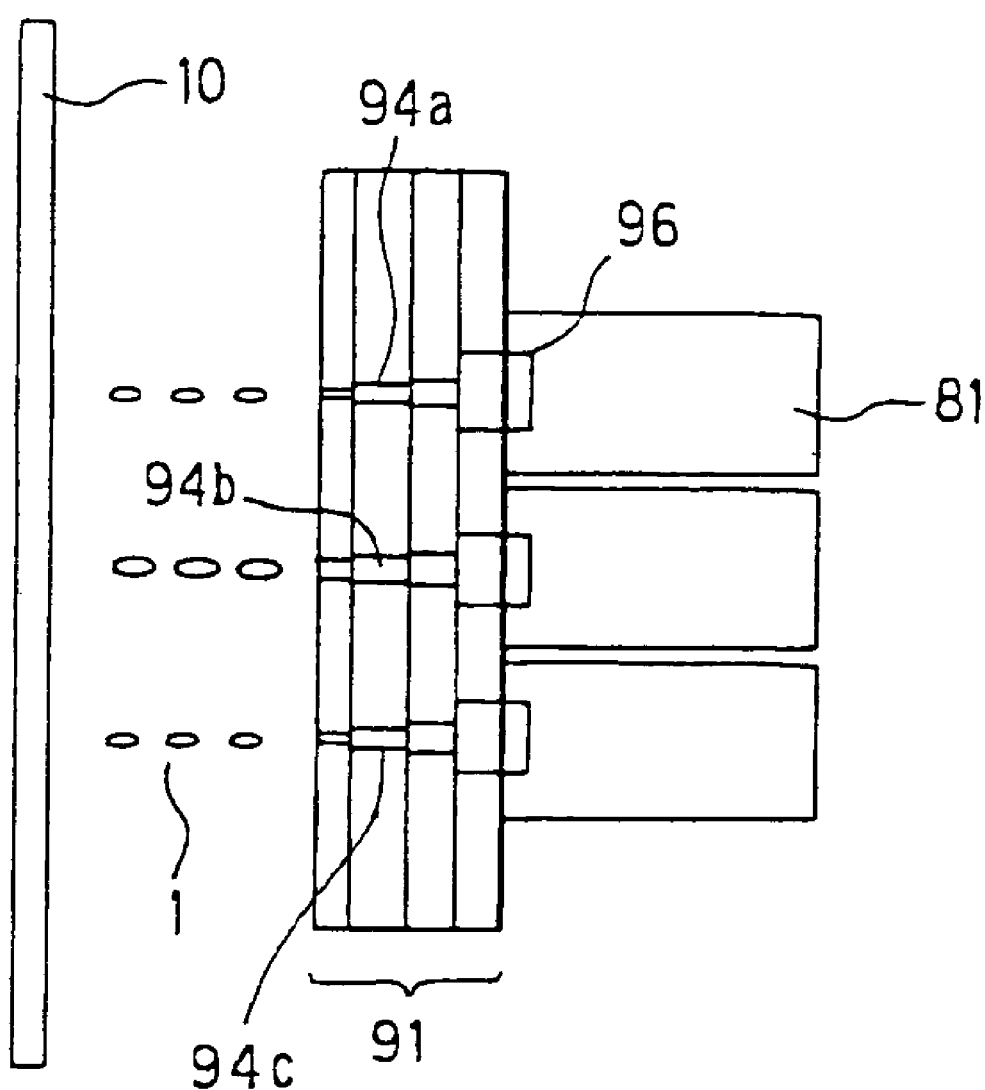
FIG. 10 is a B-B sectional view of FIG. 8($a$).

Moreover, in the present invention, as shown in FIG. 10, the nozzle positions and sizes of coating liquid discharge paths 94a, 94b, 94c in the coating apparatus are preferably adjusted, so that a desired amount of coating liquid is applied (FIG. 10 shows the on-demand type coating apparatus, but the continuous coating apparatus is also basically the same). In this case, the nozzle positions and sizes of the respective coating liquid discharge paths 94a, 94b, 94c do not necessarily have to be adjusted so as to open the respective coating liquid discharge paths 94a, 94b, 94c at equal intervals and to obtain the same nozzle size among the respective coating liquid discharge paths. It is also preferable to set different nozzle sizes or positions of the respective coating liquid discharge paths 94a, 94b, 94c among discharge heads or in the same discharge head.

Accordingly, it is possible to simultaneously coat and form a portion which requires pattern precision and a portion which does not require such precision, and the patterning of desired coatings can be efficiently made. More concretely, in consideration of the mutual influence of the nozzle size and position, the nozzle position or size may be adjusted so that the coating liquid can permeate through the gap between the projecting portion of the piezoelectric/electrostrictive layer and the substrate and complete coating of each electrode can be avoided.

For example, as shown in FIG. 7, in the peripheral edge of the piezoelectric/electrostrictive operation portion 78 in which there is the gap between the piezoelectric/electrostrictive layer 73 and substrate 44, the coating liquid discharge path having a largest nozzle size is disposed in the portion positioned substantially at the equal distance from the terminal portion 75a of the upper electrode 75 and from the terminal portion 77a of the lower electrode 77, and the portion 2 is coated with the largest amount of coating liquid. In the peripheral edge of the piezoelectric/electrostrictive operation portion 78, the portions 1a and 3 positioned in the vicinity of the terminal portion 77a of the upper or lower electrode (within 0.5 mm from each terminal portion 75a) are preferably coated with a small amount of coating liquid by opening the coating liquid discharge paths having the smallest nozzle size.

When the amount and position to be coated are adjusted in this manner, a large amount of coating liquid is diffused in the periphery and can efficiently be applied from the position most distant from the terminal portion 75a of the upper electrode 75 and from the terminal portion 77a of the lower electrode 77. Additionally, by applying a small amount in the vicinity of the terminal portions 75a, 77a of the upper electrode 75 and lower electrode 77, for the gap between the projecting portion of the piezoelectric/electrostrictive layer and the substrate, the coating liquid can permeate through the portions in the vicinity of the terminal portion 75a of the upper electrode 75 and the terminal portion 77a of the lower electrode 77 in the same manner as in the other portion while avoiding the coating of the terminal portions 75a of the respective electrodes. Therefore, while the conduction of each electrode is secured, the piezoelectric/electrostrictive film type device including the desired coupling member in the gap between the projecting portion of the piezoelectric/electrostrictive layer and the substrate and having the high resonance frequency can be manufactured.

Figure 11:
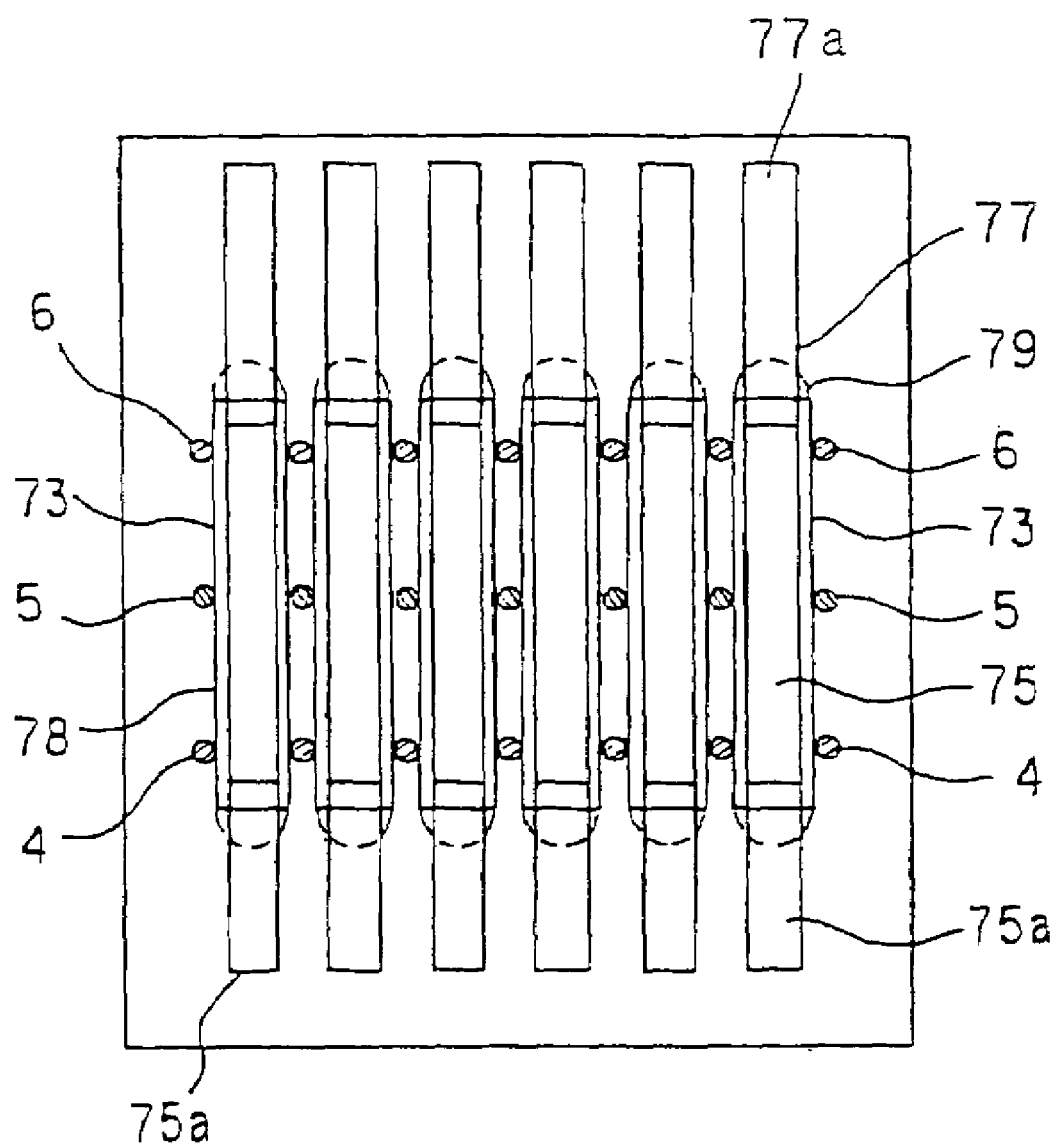
FIG. 11 is a top plan view schematically showing a state of the piezoelectric/electrostrictive film type device immediately after the application of the coating liquid having a different viscosity in the manufacturing method of the present invention.

Moreover, in the present invention, in addition to the adjustment of the coating position and amount, a discharge apparatus including a plurality of coating liquid discharge paths, a discharge apparatus including a plurality of discharge heads, or a discharge apparatus including a plurality of discharge heads including a plurality of coating liquid discharge paths is used. The viscosity or composition of the coating liquid introduced into each coating liquid discharge path is changed for each coating liquid discharge path, and a coating liquid having a different viscosity or composition may be applied to each coat position. For example, as shown in FIG. 11, a coating liquid 5 having the lowest viscosity is discharged in the peripheral edge of the piezoelectric/electrostrictive operation portion 78 including the gap between the piezoelectric/electrostrictive layer 73 and substrate 44, in the portion positioned substantially at the equal distance from the terminal portion 75a of the upper electrode 75 and the terminal portion 77a of the lower electrode 77. Coating liquids 4, 6 having a high viscosity are discharged in the peripheral edge of the piezoelectric/electrostrictive operation portion 78 to coat the portion positioned in the vicinity of the terminal portions 75a, 77a of the upper electrode 75 and lower electrode 77 (within 0.5 mm from each terminal portion 75a) with the coating liquids. When the viscosity of the coating liquid is changed in accordance with the coating position, a coating liquid having a low viscosity is supplied to the position most distant from the terminal portion 75a of the upper electrode 75 and the terminal portion 77a of the lower electrode 77, and can be further diffused in the periphery, a coating liquid having a high viscosity is supplied to the position in the vicinity of the terminal portion 75a of the upper electrode 75 and the terminal portion 77a of the lower electrode 77. Accordingly, while the diffusion of the coating liquid having the low viscosity is inhibited, the coating liquid is allowed to permeate through even the portions in the vicinity of the terminal portions 75a, 77a of the upper electrode 75 and lower electrode 77 in the gap between the projecting portion of the piezoelectric/electrostrictive layer and the substrate in the same manner as in the other portions. Moreover, the coating of other portions of each electrode 75, 77 can be avoided.

Additionally, in the present invention, when a coupling member 70 for connecting the projecting portion 79 of the piezoelectric/electrostrictive layer 73 to the substrate 44 is disposed without any large drying shrinkage, the viscosity of the coating liquid is preferably 1000 cP or less, more preferably 300 cP or less, especially preferably 50 cP or less. When the on-demand type coating apparatus and continuous coating apparatus are used, a viscosity of 20 cP or less is especially preferable.

Figure 14A:
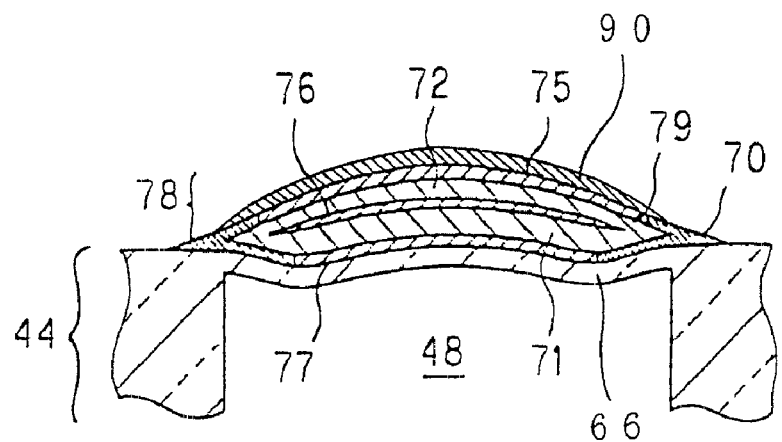
FIG. 14($a$) is a partially sectional view showing one example of the multilayered piezoelectric/electrostrictive film type device including a loosely bonded layer obtained by the manufacturing method of the present invention.
Figure 14B:
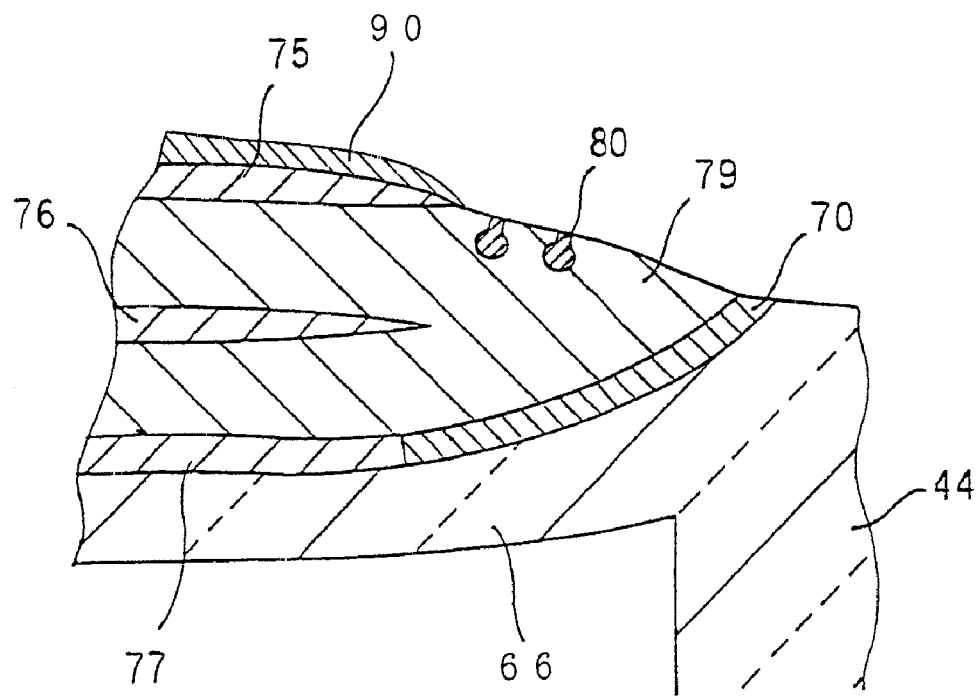
Figure 15:
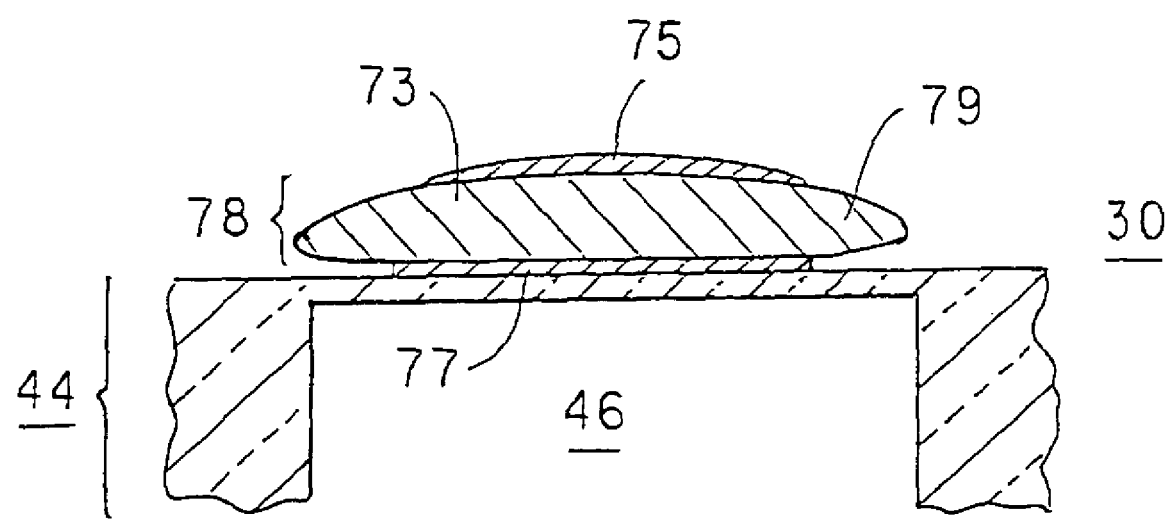
FIG. 15 is a partially sectional view showing one example of a conventional piezoelectric/electrostrictive film type device.

Moreover, in the manufacturing method of the present invention, as shown in FIGS. 14(a) and 14(b), a piezoelectric/electrostrictive film type device is manufactured in which micro-pores 80 are formed in the piezoelectric/electrostrictive layer 79 (including a contact surface of the piezoelectric/electrostrictive layer 79 with the upper electrode 75) or the upper electrode 75 are filled with a coating liquid. Alternatively, a piezoelectric/electrostrictive film type device is manufactured in which a micro restraint layer 90 of the same material as that of the coupling member 70 is disposed in a predetermined thickness to coat the contact surface of the piezoelectric/electrostrictive layer 79 with the upper electrode 75 or the upper electrode 75. A piezoelectric/electrostrictive film device is also manufactured in which micropores 80 are formed on the surface of the piezoelectric/electrostrictive layer 79 as shown in FIG. 14(b). In this case, the surface of the upper electrode 75 may also be coated with the coating liquid.

Additionally, a loosely bonding force needs to be minimized. Therefore, the thickness of the loosely bonded layer is preferably 1/15 or less with respect to a total thickness of the thin portion 66 and piezoelectric/electrostrictive operation portion, more preferably 1/30 or less. Both the on-demand type coating apparatus and the continuous coating apparatus can preferably be used. When a thinner film is prepared in the present apparatus, the viscosity is set to 0.5 to 5 cP, and the dropping rate is preferably set to 3 m/second or more. Furthermore, when only the opened micro-pores portions are filled with the coating liquid, compressed air may be sprayed after the coating. It is to be noted that in the piezoelectric/electrostrictive film type device including the filled micro-pores 80 or the loosely bonded layer 90, insulation of the piezoelectric/electrostrictive operation portion can be enhanced.

In the present invention, the coating liquid is preferably applied while vibrating at least the piezoelectric/electrostrictive layer or the substrate. Since the coating liquid can securely be supplied between the substrate and piezoelectric/electrostrictive layer without including any bubbles, the substrate can more firmly be connected to the piezoelectric/electrostrictive layer.

In this case, examples of vibrating means include: an ultrasonic vibrator 110 disposed on a stage 4 to which the piezoelectric/electrostrictive film type device 10 is fixed to mainly vibrate the substrate 44 as shown in FIG. 9(a); or vibrating means for applying a voltage to the piezoelectric/electrostrictive operation portion of the piezoelectric/electrostrictive operation portion of the piezoelectric/electrostrictive film type device 10 from an external power source (not shown) to vibrate the piezoelectric/electrostrictive operation portion.

The coating liquid for use in forming the coupling member in the present invention preferably includes inorganic particles and polymerizable oligomer mixed in a dispersion. When this coating liquid is used, the coupling member can be formed including a hybrid material including the inorganic particles scattered in a matrix of a polymer compound. It is possible to obtain the piezoelectric/electrostrictive film type device which has the flexural displacement equal to that of the conventional piezoelectric/electrostrictive film type device but which is superior in high-speed response. In a drying step performed in forming the coupling member, shrinkage of the coupling member is inhibited, and the coupling member or the piezoelectric/electrostrictive layer can be prevented from being cracked. It is to be noted that in the present invention, it is possible to use the coating liquid containing the above-described polymer compound mixed in the dispersion from the beginning, but the polymerizable oligomer is preferably mixed in the dispersion in order to form the coupling member having preferable properties.

In the present invention, examples of a dispersing medium for use in the coating liquid include water, methanol, ethanol, propanol, isopropyl alcohol, butanol, and acetone. These polar dispersing mediums are preferable because a homogeneous dispersion is easily obtained.

Moreover, examples of the inorganic particles mixed in the dispersing medium preferably include particles of an oxide containing at least one element selected from Ti, Zr, V, Nb, Cr, Mo, W, Al, Mn, Fe, Co, Ni and Si. These inorganic particles can be used as one type alone or as a combination of two or more types.

Moreover, an average particle diameter of the inorganic particles is preferably 5 nm to 1 μm, more preferably 10 nm to 200 nm. When the average particle diameter is less than 5 nm, the effect of reducing the shrinkage of the coupling member is small during the drying step in forming the coupling member. On the other hand, when the average particle diameter exceeds 1 μm, the inorganic particles are easily precipitated in the coating liquid, and it is difficult to obtain a homogeneous coupling member.

Moreover, when the average particle diameter of the inorganic particles is in this range, it is possible to satisfy the requirement that restraint of the coupling member with respect to the piezoelectric/electrostrictive layer is avoided and the requirement that the rigidity of the piezoelectric/electrostrictive layer 73 is increased to enhance the high-speed response with good balance.

Furthermore, the inorganic particles further have a two-peaks type particle size distribution. A ratio (D/C) of an average particle diameter (C) of large-diameter inorganic particles having a diameter larger than that corresponding to an inflection point existing between two peaks to an average particle diameter (D) of small-diameter inorganic particles having a diameter smaller than that corresponding to the inflection point is preferably 0.05 to 0.7, more preferably 0.1 to 0.5.

When the inorganic particles have the two-peaks type particle size distribution, voids among the large-diameter inorganic particles can be filled with the small-diameter inorganic particles to raise a volume fraction of the inorganic particles in the coupling member. Therefore, in the drying step included in the formation of the coupling member, the shrinkage of the coupling member can be further reduced, the rigidity of the piezoelectric/electrostrictive layer 73 is further increased, and the high-speed response can further be enhanced.

Moreover, for the inorganic particles which have the two-peaks type particle size distribution, a ratio (F/E) of a mass (E) of the large-diameter inorganic particles to a mass (F) of the small-diameter inorganic particles is similarly preferably 0.05 to 0.7, more preferably 0.1 to 0.5.

Furthermore, examples of the polymerizable oligomer in the present invention include a polymerizable oligomer for a vinyl polymer such as an acryl resin, addition polymer such as an epoxy resin and polyurethane, condensed polymer such as polyester and polycarbonate, and polysiloxane polymer (polymer having repeating unit of Si—O—Si) which is polymer of an organic silicon compound. Above all, in view of providing resistance to heat, water, and chemicals, and of providing water repellency, a polymerizable oligomer in which several to several tens of monomers shown in the following general formula (1) are condensation-polymerized is preferable:

$$R_n Si (OR')_{4-n} \ldots (1);$$

where R and R' denote the same type or different types of organic groups, and n is an integer of 0 to 3.

In the present invention, in the above general formula (1), the organic group represented by R includes alkyl groups such as a methyl group, ethyl group, and propyl group, aryl groups such as a phenyl group, alkenyl groups such as a vinyl group, and substituent alkyl groups such as a γ-methacryloxypropyl group, γ-glycidoxypropyl group, γ-chloropropyl group, γ-mercaptopropyl group, γ-aminopropyl group, and trifluoromethyl group. The organic group represented by of R' include the alkyl groups such as the methyl group, ethyl group, propyl group, and butyl group, the aryl groups such as the phenyl group, and the substituent alkyl groups such as a β-methoxy ethoxy group, and acetyl group.

It is to be noted that in the present invention, the polymerizable oligomer is condensation-polymerized, for example, by dehydration or dealcoholization reaction by the drying described later, and accordingly desired polymer compounds constituting the matrix of the coupling member may be obtained.

In the present invention, a blend ratio of the polymerizable oligomer to the inorganic particles is preferably set to be in an appropriate range in accordance with the type of each component. For example, when using a polymerizable oligomer obtained by condensation-polymerizing the monomers shown in the general formula (1), the inorganic particles are preferably contained in the coating liquid at a ratio of 0.1 to 300 parts by weight with respect to 100 parts by weight of the polymerizable oligomer. It is more preferable for the coating liquid to contain the inorganic particles at a ratio of 1 to 100 parts by weight.

In the present invention, for the coating liquid, it is possible to combine the polymerizable oligomer for various types of polymer compounds described above with various types of inorganic particles. Above all, the solution preferably contain the polymerizable oligomer for polysiloxane and the silica particles, more preferably the polymerizable oligomer shown in the above general formula (I) and silica particles.

When the coupling member 70 is formed by the coating liquid of the composition, the rigidity of the piezoelectric/electrostrictive layer 73 in the resulting piezoelectric/electrostrictive film type device is large without reducing the flexural displacement of the thin portion 66 and piezoelectric/electrostrictive layer 73. Furthermore, since the tenacity of the formed coupling member 70 is high, resistance to high-speed repeated driving of the piezoelectric/electrostrictive film type device may be enlarged.

In the present invention, after applying the coating liquid, the coupling member is formed by drying. During the drying step, appropriate conditions are preferably selected in accordance with the composition of the coating liquid. For example, the coating liquid is mixed with a polymerizable oligomer in accordance with vinyl polymers such as the acryl resin, addition polymers such as the epoxy resin and polyurethane, or condensation polymers such as polyester and polycarbonate. In this case, after applying the coating liquid, the layer is left to stand at room temperature and the drying may be performed.

On the other hand, the polymerizable oligomer for the polysiloxane polymer is mixed in the coating liquid. In this case, after applying the coating liquid, the layer is left to stand for ten or more minutes at the room temperature, a large part of solvent is removed, and thereafter an atmospheric temperature is raised at a desired temperature at a rate of 600° C./Hr or less preferably to perform the drying by heating.

When the heating and drying steps are performed immediately after coating, or the temperature is rapidly raised to perform the drying, the solvent in the coating liquid rapidly evaporates. Accordingly, the coating liquid rapidly contracts, cracks are generated in the coupling member, or an interface between the coupling member, and the piezoelectric/electrostrictive layer sometimes peels.

Moreover, drying by heating is preferably performed at a temperature of 60 to 120° C., more preferably at 100 to 120° C. When drying at a temperature exceeding 120° C., for reasons associated with leaving it to stand at room temperature, the solvent in the coating liquid rapidly evaporates, the coating liquid accordingly rapidly contracts, and the coupling member is cracked, or the interface between the material, and the piezoelectric/electrostrictive layer sometimes peels. On the other hand, when drying is performed at a lower temperature than the heating temperature, the organic solvent and moisture dissolved in the solvent are not sufficiently removed.

When the coating liquid mixed with the polymerizable oligomer corresponding to the polysiloxane polymer is applied, further after drying, a hardening treatment by heating at a higher temperature is preferably performed continuously or in a separate step. Concretely, heating preferably at a temperature of 700° C. or less is preferable, heating at a temperature of 600° C. or less is more preferably, heating at a temperature less than 500° C. is further preferable, and heating at a temperature less than 450° C. is especially preferable.

When the temperature of the hardening treatment by heating exceeds the above-described temperature range, components such as Si in the coupling member react with the material constituting the piezoelectric/electrostrictive layer to deteriorate the capabilities of the piezoelectric/electrostrictive layer. According to circumstances, since defects are generated in the piezoelectric/electrostrictive layer, dielectric or mechanical breakdown sometimes occurs. The organic components in the coupling member are decomposed, and the coupling member is sometimes cracked.

It is to be noted that in the present invention, when the constituting ratio of the polymerizable oligomer to the inorganic particles in the coating liquid is adjusted, or when the heating temperature at the hardening treatment time is adjusted to change the bond strength of an Si—O—Si bond, it is possible to optimize the mechanical properties such as hardness (hardness rises as the temperature rises), and chemical properties such as water repellency.

Figure 12:
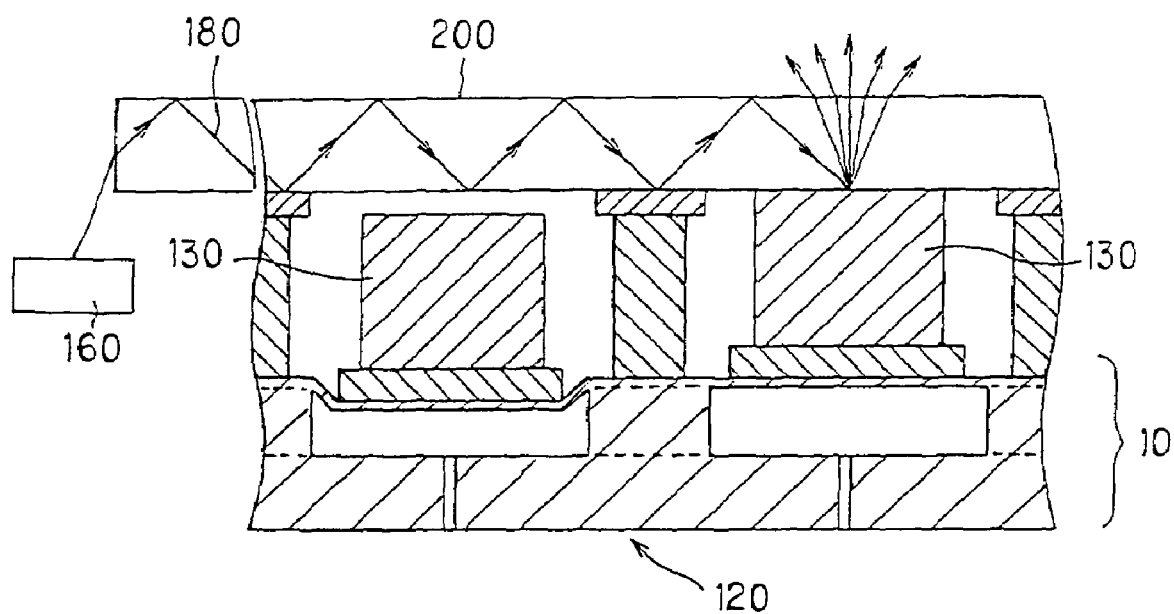
FIG. 12 is a sectional view showing one example of a display device in which the piezoelectric/electrostrictive film type device obtained by the manufacturing method of the present invention is used.
Figure 13:
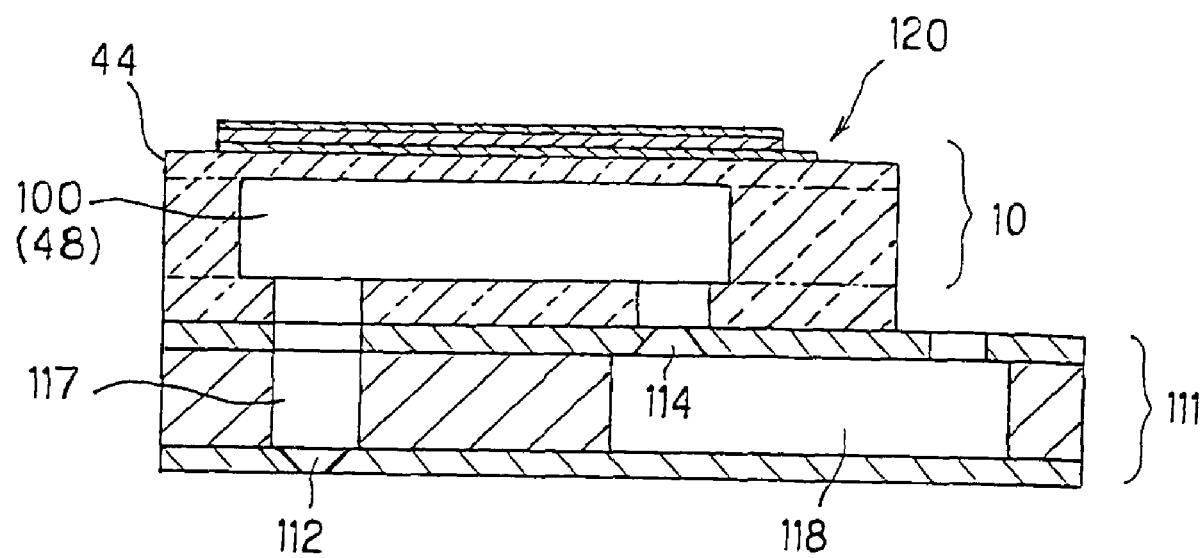
FIG. 13 is a sectional view showing one example of an ink jet printer head in which the piezoelectric/electrostrictive film type device obtained by the manufacturing method of the present invention is used.

The piezoelectric/electrostrictive film type device and the method of manufacturing the device according to the present invention have been described above, but the piezoelectric/electrostrictive film type device obtained by the method of manufacturing the present invention can be used, for example, as a driving portion 120 of a display device or ink jet printer head as shown in FIGS. 12, 13. Concretely, as shown in FIG. 12, a light guide plate 200 for introducing a light 180 from a light source 160 is disposed. Additionally, the driving portion 120 including the piezoelectric/electrostrictive film type device 10 of the present invention as a main constituting element is disposed opposite to the rear surface of the light guide plate 200, and opposite to a pixel. Furthermore, pixel constituting materials 130 are stacked on the driving portion 120, and the pixel constituting materials 130 can be connected to or disconnected from the light guide plate 200 by a driving operation of the driving portion 120 to constitute the display device. Moreover, as shown in FIG. 13, the driving portion 120 including the piezoelectric/electrostrictive film type device 10 of the present invention as the main constituting element and including a pressurizing chamber 100 constituted of the cavity 48 of the substrate 44 is integrally bonded to an ink nozzle member 111. The member includes a nozzle 112 opened to the outside from the pressurizing chamber 100 of the driving portion 120 through a channel for ink jet 117, and an orifice 114 opened into the pressurizing chamber 100 of the driving portion 120 from an ink supply source through a channel for ink supply 118. Accordingly, the ink jet printer head can be constituted. One may employ the construction of the display device or the ink jet printer head disclosed in JP-A-2001-343598 and JP-A-11-147318 as a concrete example. Thus, the whole contents of those laid-open publications have been incorporated herein by reference.

EXAMPLE

The present invention will concretely be described hereinafter by examples of a piezoelectric film type device, but the present invention is not limited to these examples. It is to be noted that evaluation was performed as follows with respect to each example and comparative example.

Evaluation Method
a. Flexural Displacement
An electric field of 3 kV/mm was applied to each piezoelectric film type device obtained in each example or comparative example at room temperature. The resulting displacement was measured using a laser Doppler vibration meter.

Resonance Frequency
The resonance frequency of the piezoelectric film type device obtained in each example or comparative example was measured using the laser Doppler vibration meter and FFT analyzer.

Concretely, a swept sine waveform generated by the FFT analyzer (waveform containing a plurality of frequency components) was applied to the device to drive the device. The vibration of the device was measured with the laser Doppler vibration meter, a speed output of the laser Doppler vibration meter was inputted into the FFT analyzer to analyze the frequency, and a lowest peak was regarded as the resonance frequency.

Example 1

A platinum lower electrode (dimension: 1.7×0.8 mm (in the length of 1.7 mm, 0.3 mm corresponds to the terminal portion), thickness: 3 µm) was formed on a substrate whose thin portion and fixing portion were both made of $Y_2O_3$-stabilized $ZrO_2$ (dimension of the thin portion: 1.6×1.1 mm, thickness: 10 µm) by screen printing. Heat treatment at a temperature of 1300° C. for 2 hours was carried out to integrate the electrode with the substrate.

Thereon, a piezoelectric material constituted of $(Pb_{0.999}La_{0.001})(Mg_{1/3}Nb_{2/3})_{0.375}Ti_{0.375}Zr_{0.250}O_3$ in which a part of Pb was substituted with 0.1 mol % of La (average particle diameter of 0.49 µm, maximum particle diameter of 1.8 µm) was laminated at a thickness of 20 µm in a broader range of 1.3×0.9 mm, including the surface disposed opposite to the upper surface of the lower electrode, by screen printing.

Subsequently, an atmosphere-controlling material having the same composition as that of the piezoelectric material was placed in a container, and the laminate of the piezoelectric material on the electrode-formed substrate was heat-treated at 1275° C. for two hours. The thickness of the piezoelectric layer after the heat treatment was 13 µm.

Subsequently, a gold upper electrode was formed at a thickness of 0.5 µm in a range of 1.7 mm×0.8 mm (in the length of 1.7 mm, 0.3 mm corresponds to the terminal portion) on the piezoelectric layer by screen printing, and heat-treated at 60° C.

Subsequently, the thus obtained device was fixed onto a sample stage of the coating apparatus after covering its surface opposite to the one in which the piezoelectric/electrostrictive layer and electrode had been disposed with a UV sheet so that the device was easily firmly fixed on said sample stage. 30% by mass of colloidal silica having two-peaks particle size distribution and containing in a mixed state a large-diameter amorphous silica having an average particle diameter of 100 nm larger than an inflection point of 50 nm existing between two peaks and a small-diameter amorphous silica having an average particle diameter of 20 nm smaller than the inflection point of 50 nm were mixed with 70% by mass of a polymerizable oligomer solution to prepare a coating liquid. The solution was prepared by mixing 20% by mass of an equimolor mixture of tetraethoxysilane and methylethoxysilane with a mixed dispersing medium of isopropyl alcohol and water.

The device was coated with the solution using the on-demand type coating apparatus including three coating liquid discharge paths. In this case, the nozzle sizes of the respective coating liquid discharge paths were set to φ0.03 nm, φ0.07 mm, and φ0.03 mm. For the coating liquid discharge path having a nozzle size of φ0.07 mm, the nozzle position of each coating liquid discharge path was set to a position substantially at an equal distance from the terminal portions of the upper electrode 75 and lower electrode 77 in the piezoelectric/electrostrictive operation portion peripheral edge (on opposite sides of the thin portion in a short direction) in which the gap between the piezoelectric/electrostrictive layer and substrate is opened. For the coating liquid discharge path having a nozzle size of φ0.03 mm, the nozzle position was set to a position of 0.45 mm on the opposite sides of the thin portion in a longitudinal direction. The discharge amount per droplet was set to 200 pL/droplet in the coating liquid discharge path having a nozzle size of φ0.07 mm, and 70 pL/droplet in the coating liquid discharge path having a nozzle size of φ0.03 mm. Colloidal silica in which large-diameter amorphous silica were mixed with small-diameter amorphous silica was prepared by mixing and stirring 70% by mass of colloidal silica (solid concentration of 20% by mass) in which large-diameter amorphous silica having an average particle diameter of 100 nm was dispersed in isopropyl alcohol with 30% by mass of colloidal silica (solid concentration of 20% by mass) in which small-diameter amorphous silica having an average particle diameter of 20 nm was dispersed in isopropyl alcohol.

Finally, the piezoelectric/electrostrictive film type device coated with the coating liquid was left to stand at room temperature for 30 minutes. Thereafter, the temperature was raised at a temperature rise rate of 200° C./h, held at 80° C. to 120° C. for one hour, and continuously raised at 300° C. At that temperature, the hardening treatment was performed for 60 minutes, the coupling member for connecting the whole projecting portion of the piezoelectric/electrostrictive layer to the substrate was hardened, and the piezoelectric/electrostrictive film type device was manufactured.

The obtained piezoelectric/electrostrictive film type device had a flexural displacement of 0.14 µm, and a resonance frequency of 1.65 MHz. The surface of a conductive portion of each electrode of the piezoelectric/electrostrictive film type device remained exposed, and was ready for the solder bonding of conductive wires to the electrode.

Comparative Example

The piezoelectric/electrostrictive film type device was manufactured in the same manner as in Example 1 except that the entire piezoelectric/electrostrictive film type device was coated with the coating liquid using a spin coating apparatus instead of the discharge apparatus.

The obtained piezoelectric/electrostrictive film type device had a flexural displacement of 0.14 µm, and a resonance frequency of 1.65 MHz. However, in the obtained piezoelectric/electrostrictive film type device, the conductive portion of each electrode was coated, and was not ready for the solder bonding. Accordingly, it was necessary to remove the coating layer in order to secure the conduction.

As described above, according to the present invention, a method of manufacturing a piezoelectric/electrostrictive film type device is provided, in which a piezoelectric/electrostrictive film type device that is capable of obtaining a high resonance frequency and which has superior in a high-speed response can be efficiently manufactured while securing the conductivity of the electrodes.

What is claimed is:

1. A method of manufacturing a piezoelectric/electrostrictive film device comprising a ceramic substrate and a piezoelectric/electrostrictive operation portion formed on said ceramic substrate, said piezoelectric/electrostrictive operation portion including a lower electrode, a piezoelectric/electrostrictive layer, and an upper electrode, wherein said piezoelectric/electrostrictive layer is formed to extend beyond ends of at least one of said electrodes so that ends of a projected portion of said piezoelectric/electrostrictive layer project beyond said ends of said at least one electrode, said method comprising the steps of:

forming said piezoelectric/electrostrictive layer of said piezoelectric/electrostrictive operation portion so that ends of said projected portion of said piezoelectric/electrostrictive layer project beyond ends of at least one of said electrodes;

preparing a coating liquid by admixing a polymerizable oligomer and inorganic particles in a dispersing medium in a sufficient amount to allow said coating liquid to permeate through a gap between at least said projecting portion of said piezoelectric/electrostrictive layer and said ceramic substrate;

applying said coating liquid to one or more discrete application portions of said at least one electrode using a coating apparatus comprising
  pressurizing supply means for pressurizing/supplying said coating liquid,
  switching means disposed in a supply path of said pressurizing supply means to switch a supply of said coating liquid, and
  a discharge head for discharging said coating liquid introduced from said supply path of said pressurizing supply means to the outside, said discharge head comprising
    a discharge head substrate including a coating liquid introduction path connected to said supply path of said pressurizing supply means,
    a pressurizing chamber in which said coating liquid introduction path opens,
    one or more coating liquid discharge paths connected to said pressurizing chamber and opened to the outside, and
    a piezoelectric/electrostrictive operation portion disposed in a position opposing said pressurizing chamber on said discharge head substrate,
    wherein said coating liquid introduced into said pressurizing chamber is continuously discharged in an atomized droplet state by a flexural displacement of said piezoelectric/electrostrictive operation portion when said switching means is open; and drying said coating liquid to form a coupling member which couples said ends of said projected portion of said piezoelectric/electrostrictive layer to said ceramic substrate.

2. The method of manufacturing the piezoelectric/electrostrictive film device according to claim 1, wherein said applying step comprises applying said coating liquid to a plurality of said one or more discrete application portions of said at least one electrode in different amounts at different ones of said plurality of said discrete application portions using one of (1) a coating apparatus comprising a discharge head including a plurality of coating liquid discharge paths having different nozzle sizes, and (2) a coating apparatus comprising a plurality of discharge heads different from one another in the nozzle size of the coating liquid discharge path.

3. The method of manufacturing the piezoelectric/electrostrictive film device according to claim 1, wherein said applying step comprises vibrating at least one of said substrate and said piezoelectric/electrostrictive layer during said applying step.

4. A method of manufacturing a piezoelectric/electrostrictive film device comprising a ceramic substrate and a piezoelectric/electrostrictive operation portion formed on said ceramic substrate, said piezoelectric/electrostrictive operation portion including a lower electrode, a piezoelectric/electrostrictive layer, and an upper electrode, wherein said piezoelectric electrostrictive layer is formed to extend beyond ends of at least one of said electrodes so that ends of a projected portion of said piezoelectric/electrostrictive layer project beyond said ends of said at least one electrode, said method comprising the steps of:

forming said piezoelectric/electrostrictive layer of said piezoelectric/electrostrictive operation portion so that ends of said projected portion of said piezoelectric/electrostrictive layer project beyond ends of at least one of said electrodes;

preparing a coating liquid by admixing a polymerizable oligomer and inorganic particles in a dispersing medium in a sufficient amount to allow said coating liquid to permeate through a gap between at least said projecting portion of said piezoelectric/electrostrictive layer and said ceramic substrate;

applying said coating liquid to one or more discrete application portions of said at least one electrode using a coating apparatus comprising:
   a substrate including a coating liquid introduction path connected to a coating liquid supply source, a pressurizing chamber in which said coating liquid introduction path is opened, and one or more coating liquid discharge paths connected to said pressurizing chamber and opened to the outside, and
   a piezoelectric/electrostrictive operation portion disposed in a position opposing said pressurizing chamber;
   wherein said coating liquid introduced into said pressurizing chamber is discharged in an atomized droplet state in accordance with a flexural displacement of said piezoelectric/electrostrictive operation portion; and
drying said coating liquid to form a coupling member which couples said ends of said projected portion of said piezoelectric/electrostrictive layer to said ceramic substrate.

5. The method of manufacturing the piezoelectric/electrostrictive film device according to claim 4, wherein said applying step comprises applying said coating liquid to a plurality of said one or more discrete application portions of said at least one electrode in different amounts at different ones of said plurality of said discrete application portions using a coating apparatus comprising a plurality of coating liquid discharge paths having different nozzle sizes.

6. The method of manufacturing the piezoelectric/electrostrictive film device according to claim 4, wherein said applying step comprises vibrating at least one of said substrate and said piezoelectric/electrostrictive layer during said applying step.

7. A method of manufacturing a piezoelectric/electrostrictive film device comprising a ceramic substrate and a piezoelectric/electrostrictive operation portion formed on said ceramic substrate, said piezoelectric/electrostrictive operation portion comprising a multilayered structure including a plurality of lower electrodes, a plurality of piezoelectric/electrostrictive layers, and a plurality of upper electrodes alternately stacked on said substrate so that ends of a projected portion of said piezoelectric/electrostrictive layers project beyond ends of at least one of said electrodes, said method comprising the steps of:
   forming said piezoelectric/electrostrictive layers of said piezoelectric/electrostrictive operation portion so that ends of said projected portion of said piezoelectric/electrostrictive layers project beyond ends of at least one of said electrodes;
   preparing a coating liquid by admixing a polymerizable oligomer and inorganic particles in a dispersing medium in a sufficient amount to allow said coating liquid to permeate through a gap between at least said projecting portion of said piezoelectric/electrostrictive layers and said ceramic substrate;
   applying said coating liquid to one or more discrete application portions of said at least one electrode using a coating apparatus comprising:
      pressurizing supply means for pressurizing/supplying said coating liquid,
      switching means disposed in a supply path of said pressurizing supply means to switch a supply of said coating liquid, and
      a discharge head for discharging said coating liquid introduced from the supply path of the pressurizing supply means to the outside, said discharge head comprising
         a discharge head substrate including a coating liquid introduction path connected to said supply path of said pressurizing supply means,
         a pressurizing chamber in which said coating liquid introduction path opens,
         one or more coating liquid discharge paths connected to said pressurizing chamber and opened to the outside, and
         a piezoelectric/electrostrictive operation portion disposed in a position opposing said pressurizing chamber on said discharge head substrate,
      wherein said coating liquid introduced into said pressurizing chamber is continuously discharged in an atomized droplet state by a flexural displacement of said piezoelectric/electrostrictive operation portion when said switching means is open, and
   drying said coating liquid to form a coupling member which couples said ends of said projected portion of said piezoelectric/electrostrictive layers to said ceramic substrate.

8. The method of manufacturing the piezoelectric/electrostrictive film device according to claim 7, wherein said applying step comprises applying said coating liquid to a plurality of said one or more discrete application portions of said at least one electrode in different amounts at different ones of said plurality of said discrete application portions using one of (1) a coating apparatus comprising a discharge head including a plurality of coating liquid discharge paths having different nozzle sizes, and (2) a coating apparatus comprising a plurality of discharge heads different from one another in the nozzle size of the coating liquid discharge path.

9. The method of manufacturing the piezoelectric/electrostrictive film device according to claim 7, wherein said applying step comprises vibrating at least one of said substrate and said piezoelectric/electrostrictive layers while said coating liquid is applied.

10. A method of manufacturing a piezoelectric/electrostrictive film device comprising a ceramic substrate and a piezoelectric/electrostrictive operation portion formed on said ceramic substrate, said piezoelectric/electrostrictive operation portion comprising a multilayered structure including a plurality of lower electrodes, a plurality of piezoelectric/electrostrictive layers, and a plurality of upper electrodes alternately stacked on said substrate so that ends of a projected portion of said piezoelectric/electrostrictive layers project beyond ends of at least one of said electrodes, said method comprising the steps of:
   forming said piezoelectric/electrostrictive layers of said piezoelectric/electrostrictive operation portion so that ends of said projected portion of said piezoelectric/electrostrictive layers project beyond ends of at least one of said electrodes;
   preparing a coating liquid by admixing a polymerizable oligomer and inorganic particles in a dispersing medium in a sufficient amount to allow said coating liquid to permeate through a gap between at least said projecting portion of said piezoelectric/electrostrictive layers and said ceramic substrate;

applying said coating liquid to one or more discrete application portions of said at least one electrode using a coating apparatus comprising:

a substrate including a coating liquid introduction path connected to a coating liquid supply source, a pressurizing chamber in which said coating liquid introduction path is opened, and one or more coating liquid discharge paths connected to said pressurizing chamber and opened to the outside, and a piezoelectric/electrostrictive operation portion disposed in a position opposing said pressurizing chamber, wherein said coating liquid introduced into said pressurizing chamber is discharged in an atomized droplet state in accordance with a flexural displacement of said piezoelectric/electrostrictive operation portion; and drying said coating liquid to form a coupling member which couples said ends of said projected portion of said piezoelectric/electrostrictive layers to said ceramic substrate.

11. The method of manufacturing the piezoelectric/electrostrictive film device according to claim 10, wherein said applying step comprises applying said coating liquid to a plurality of said one or more discrete application portions of said at least one electrode in different amounts at different ones of said plurality of said discrete application portions using a coating apparatus comprising a plurality of coating liquid discharge paths having different nozzle sizes.

12. The method of manufacturing the piezoelectric/electrostrictive film device according to claim 10, wherein said applying step comprises vibrating at least one of said substrate and said piezoelectric/electrostrictive layers while said coating liquid is applied.

* * * * *